United States Patent
Hamade et al.

(10) Patent No.: US 10,050,209 B2
(45) Date of Patent: Aug. 14, 2018

(54) LIGHT-EMITTING ELEMENT, LIGHT-EMITTING DEVICE, AUTHENTICATION DEVICE, AND ELECTRONIC APPARATUS

(71) Applicant: Seiko Epson Corporation, Tokyo (JP)

(72) Inventors: Yuiga Hamade, Fujimi (JP); Tetsuji Fujita, Chino (JP)

(73) Assignee: Seiko Epson Corporation (JP)

( * ) Notice: Subject to any disclaimer, the term of this patent is extended or adjusted under 35 U.S.C. 154(b) by 90 days.

(21) Appl. No.: 15/157,672

(22) Filed: May 18, 2016

(65) Prior Publication Data
US 2016/0359117 A1 Dec. 8, 2016

(30) Foreign Application Priority Data
Jun. 3, 2015 (JP) .................................. 2015-113354

(51) Int. Cl.
*B32B 9/00* (2006.01)
*B32B 19/00* (2006.01)
(Continued)

(52) U.S. Cl.
CPC ........ *H01L 51/0061* (2013.01); *C09K 11/025* (2013.01); *C09K 11/06* (2013.01); *H01L 51/0052* (2013.01); *H01L 51/0058* (2013.01); *H01L 51/0071* (2013.01); *H01L 51/0072* (2013.01); *H01L 51/5004* (2013.01);
(Continued)

(58) Field of Classification Search
None
See application file for complete search history.

(56) References Cited

U.S. PATENT DOCUMENTS 6,344,283 B1 * 2/2002 Inoue .................... C09K 11/06
                                                             313/504
6,680,131 B1   1/2004 Ishibashi et al.
(Continued)

FOREIGN PATENT DOCUMENTS

JP   10-110163 A    4/1998
JP   2000-091073 A  3/2000
(Continued)

OTHER PUBLICATIONS

Salbeck et al., J. Synthetic Metals 91, (1997), 209-215.*
(Continued)

*Primary Examiner* — Eli Mekhlin
(74) *Attorney, Agent, or Firm* — Harness, Dickey & Pierce, P.L.C.

(57) ABSTRACT

A light-emitting element includes an anode, a cathode, a light-emitting layer which is provided between the anode and the cathode and emits light in a wavelength range of 700 nm or more by conducting electricity between the anode and the cathode, and an electron transport layer which is provided between the light-emitting layer and the cathode, and includes a first electron transport layer located on the cathode side and a second electron transport layer located on the light-emitting layer side, wherein organic materials contained in the light-emitting layer, a hole injection layer, the first electron transport layer, and the second electron transport layer have a glass transition temperature Tg of 135° C. or higher or do not have a glass transition temperature.

12 Claims, 4 Drawing Sheets

(51) Int. Cl.
- *H01L 51/00* (2006.01)
- *C09K 11/06* (2006.01)
- *C09K 11/02* (2006.01)
- *H05B 33/14* (2006.01)
- *H05B 33/20* (2006.01)
- *H01L 51/50* (2006.01)

(52) U.S. Cl.
CPC ............ *H05B 33/14* (2013.01); *H05B 33/20* (2013.01); *C09K 2211/1007* (2013.01); *C09K 2211/1014* (2013.01); *C09K 2211/1081* (2013.01); *H01L 51/0054* (2013.01); *H01L 51/0059* (2013.01); *H01L 51/508* (2013.01); *H01L 51/5012* (2013.01); *H01L 2251/556* (2013.01)

(56) References Cited

U.S. PATENT DOCUMENTS

| | | | |
|---|---|---|---|
| 2001/0019783 A1 | 9/2001 | Sakai et al. | |
| 2003/0072966 A1* | 4/2003 | Hosokawa | B01J 31/24 |
| | | | 428/690 |
| 2003/0082406 A1* | 5/2003 | Murase | C07F 5/022 |
| | | | 428/690 |
| 2006/0154105 A1 | 7/2006 | Yamamoto et al. | |
| 2007/0088185 A1* | 4/2007 | Kubota | C07C 13/567 |
| | | | 585/407 |
| 2008/0049413 A1 | 2/2008 | Jinde et al. | |
| 2009/0279285 A1 | 11/2009 | Nakayama et al. | |
| 2012/0267615 A1* | 10/2012 | Fujita | C09K 11/06 |
| | | | 257/40 |

FOREIGN PATENT DOCUMENTS

| | | |
|---|---|---|
| JP | 2001-110570 A | 4/2001 |
| JP | 2004-002297 A | 1/2004 |
| WO | WO-2007-049470 A1 | 5/2007 |
| WO | WO-2008-023623 A1 | 2/2008 |
| WO | WO-2016-002159 A1 | 1/2016 |

OTHER PUBLICATIONS

Quian et al., "Near-Infrared Organic Compounds and Emerging Applications", Chemistry Asian Journal, vol. 5, pp. 1006-1029 (2010).

* cited by examiner

LIGHT-EMITTING ELEMENT, LIGHT-EMITTING DEVICE, AUTHENTICATION DEVICE, AND ELECTRONIC APPARATUS

BACKGROUND

1. Technical Field

The present invention relates to a light-emitting element, a light-emitting device, an authentication device, and an electronic apparatus.

2. Related Art

An organic electroluminescence element (a so-called organic EL element) is a light-emitting element having a structure in which at least one light-emitting organic layer is interposed between an anode and a cathode. In this light-emitting element, by applying an electrical field between the anode and the cathode, an electron is injected into a light-emitting layer from the cathode side and also a hole is injected into the light-emitting layer from the anode side, and the electron and the hole are recombined in the light-emitting layer, whereby an exciton is formed, and the energy generated when this exciton is returned to a ground state is emitted as light.

As such a light-emitting element, there is known a light-emitting element which emits light in a long wavelength range exceeding 700 nm.

For example, in a light-emitting element disclosed in JP-A-2000-91073 (PTL 1) or JP-A-2001-110570 (PTL 2), by using a material in which an amino group serving as an electron donor and a nitrile group serving as an electron acceptor are allowed to coexist as functional groups in the molecule as a dopant of a light-emitting layer, the emission wavelength is increased.

Further, for example, as disclosed in JP-A-2004-2297 (PTL 3), as an electron injection layer, a layer containing an azaindolizine-based compound has been proposed.

The light-emitting element which emits light in a near-infrared range of the related art can emit light in a long wavelength range exceeding 700 nm (a near-infrared range), however, in the case where this light-emitting element is applied as, for example, a light source or the like for biometric authentication for authenticating an individual using biological information such as a vein or a fingerprint, in order to accurately obtain the biological information, it is necessary to irradiate a living body with stronger light, specifically, light with an output of about several to several tens $mW/cm^2$ or more.

Here, for example, in order to output 20 $mW/cm^2$ using a near-infrared light-emitting element which has an external quantum efficiency (EQE) of 1% and emits near-infrared light with a maximum wavelength of 1100 nm, it can be calculated that it is necessary to drive the element at 1.7 $A/cm^2$, and in order to obtain stronger light, that is, a high output, it is necessary to drive the light-emitting element at a larger current (density).

However, in the case where a light-emitting element is driven at a larger current, it cannot be said that the efficiency and life of the light-emitting element which emits light in a near-infrared range of the related art are sufficiently increased.

SUMMARY

An advantage of some aspects of the invention is to provide a light-emitting element which emits light in a near-infrared range with high efficiency and long life even if it is driven at a large current, and a light-emitting device, an authentication device, and an electronic apparatus, each of which includes this light-emitting element.

The advantage can be achieved by the invention described below.

A light-emitting element according to an aspect of the invention includes an anode, a cathode, a light-emitting layer which is provided between the anode and the cathode and emits light in a wavelength range of 700 nm or more by conducting electricity between the anode and the cathode, a hole injection layer which is provided between the light-emitting layer and the anode, and an electron transport layer which is provided between the light-emitting layer and the cathode, and includes a first electron transport layer located on the cathode side and a second electron transport layer located on the light-emitting layer side, wherein organic materials contained in the light-emitting layer, the hole injection layer, the first electron transport layer, and the second electron transport layer have a glass transition temperature Tg of 135° C. or higher or do not have a glass transition temperature.

According to this configuration, a light-emitting element which emits light in a near-infrared range with high efficiency and long life even if it is driven at a large current can be provided.

In the light-emitting element according to the aspect of the invention, it is preferred that the second electron transport layer contains a second anthracene-based compound as the organic material, and the second anthracene-based compound is an anthracene-based compound which has an anthracene skeleton but does not have a heterocyclic skeleton.

The compound having an anthracene skeleton is a compound having an excellent electron transport property. Further, by using the second anthracene-based compound which does not have a heterocyclic skeleton, the second electron transport layer shows relatively strong resistance to oxidation and reduction due to transfer of holes, and therefore alteration or deterioration due to holes can be suppressed.

In the light-emitting element according to the aspect of the invention, it is preferred that the anthracene-based compound is a compound represented by the following general formula ETL2-A.

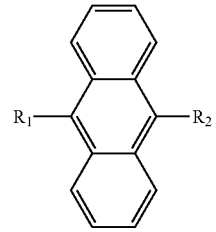

ETL2-A

In the formula ETL2-A, $R_1$ and $R_2$ are each a hydrogen atom, an alkyl group, an aryl group which may have a substituent, or an arylamino group which may have a substituent, and $R_1$ and $R_2$ may be the same as or different from each other.

According to this configuration, the second anthracene-based compound can be relatively easily obtained as a compound which has a glass transition temperature Tg of 135° C. or higher or does not have a glass transition temperature.

In the light-emitting element according to the aspect of the invention, it is preferred that the second anthracene-based compound has a glass transition temperature Tg of 145° C. or higher or does not have a glass transition temperature.

According to this configuration, the deterioration of the second electron transport layer can be more accurately suppressed or prevented from occurring, and therefore, the decrease in the light emission efficiency of the light-emitting element caused thereby can be more accurately suppressed or prevented.

In the light-emitting element according to the aspect of the invention, it is preferred that the light-emitting layer contains a host material as the organic material, the hole injection layer contains a hole-injecting material as the organic material, and the second electron transport layer contains a second anthracene-based compound as the organic material, and when the glass transition temperatures Tg of the host material, the hole-injecting material, and the second anthracene-based compound are represented by Tg(Host), Tg(HIL), and Tg(ETL2), respectively, Tg(Host), Tg(HIL), and Tg(ETL2) satisfy the following relational formula (I).

$$Tg(HIL) > Tg(Host) \text{ and } Tg(ETL2) > Tg(Host) \quad (I)$$

According to this configuration, even if the temperature of each layer included in the light-emitting element exceeds Tg(Host) by heating the light-emitting element and the light-emitting layer preferentially shows fluidity, the hole injection layer and the second electron transport layer adjacent to the light-emitting layer are accurately suppressed or prevented from showing fluidity, and therefore, the diffusion of the organic material (particularly, a light-emitting material) contained in the light-emitting layer can be prevented.

In the light-emitting element according to the aspect of the invention, it is preferred that further Tg(HIL) and Tg(ETL2) satisfy the following relational formula (II).

$$Tg(HIL) > Tg(ETL2) \quad (II)$$

According to this configuration, the change in the light emission characteristics of the light-emitting element due to the alteration or deterioration of the second electron transport layer caused by chemical interaction between the light-emitting material and the second anthracene-based compound can be minimized.

In the light-emitting element according to the aspect of the invention, it is preferred that the light-emitting element is used by conducting electricity between the anode and the cathode at a current density of 0.5 A/cm$^2$ or more and 2.0 A/cm$^2$ or less.

According to this configuration, even if the light-emitting element is driven at a large current (density), which is as large as 0.5 A/cm$^2$ or more and 2.0 A/cm$^2$ or less, the deterioration of the light-emitting element can be accurately suppressed or prevented from occurring, and therefore, the efficiency and life of the light-emitting element can be increased.

A light-emitting device according to an aspect of the invention includes the light-emitting element according to the aspect of the invention.

Such a light-emitting device can emit light in a near-infrared range. Further, the light-emitting device includes the light-emitting element which has high efficiency and long life even if it is driven at a large current, and therefore has excellent reliability.

An authentication device according to an aspect of the invention includes the light-emitting element according to the aspect of the invention.

Such an authentication device can perform biometric authentication using near-infrared light. Further, the authentication device includes the light-emitting element which has high efficiency and long life even if it is driven at a large current, and therefore has excellent reliability.

An electronic apparatus according to an aspect of the invention includes the light-emitting element according to the aspect of the invention.

Such an electronic apparatus includes the light-emitting element which has high efficiency and long life even if it is driven at a large current, and therefore has excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a light-emitting element, a light-emitting device, an authentication device, and an electronic apparatus according to the invention will be described with reference to preferred embodiments shown in the accompanying drawings.

Figure 1:
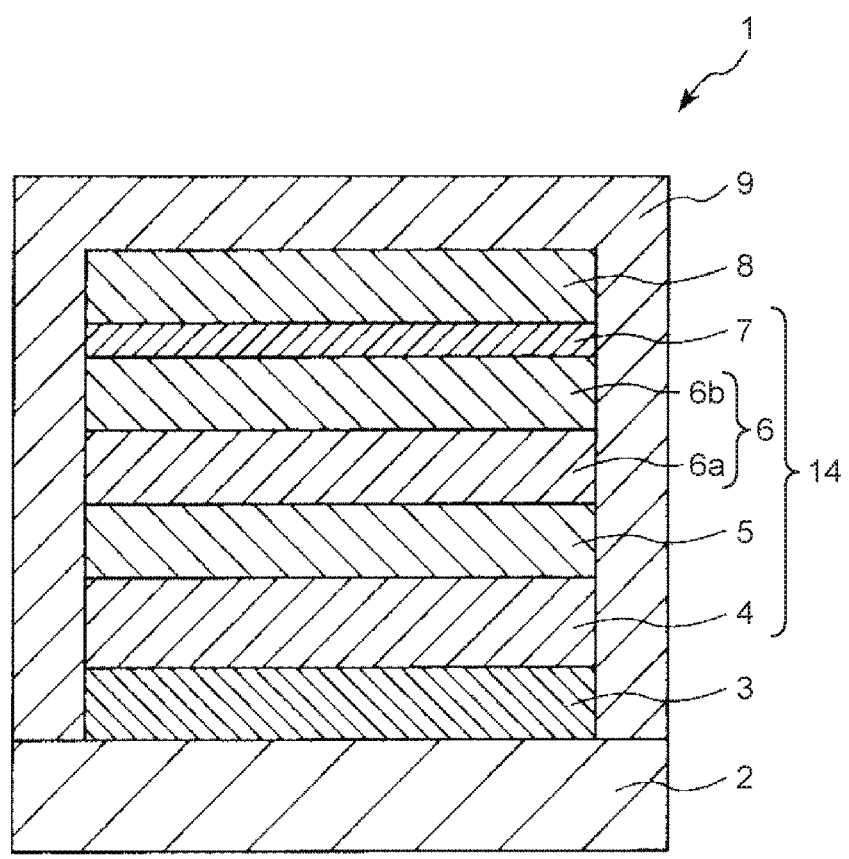
FIG. 1 is a schematic cross-sectional view showing a light-emitting element according to an embodiment of the invention.

FIG. 1 is a schematic cross-sectional view showing a light-emitting element according to an embodiment of the invention. Incidentally, hereinafter, for the sake of convenience of explanation, the upper side in FIG. 1 is referred to as "upper" and the lower side in FIG. 1 is referred to as "lower".

A light-emitting element (electroluminescence element) 1 shown in FIG. 1 includes an anode 3, a hole injection layer 4, a light-emitting layer 5, an electron transport layer 6 including a second electron transport layer 6a and a first electron transport layer 6b, an electron injection layer 7, and a cathode 8, which are stacked in this order. That is, in the light-emitting element 1, between the anode 3 and the cathode 8, a stacked body 14 in which the hole injection layer 4, the light-emitting layer 5, the electron transport layer 6, and the electron injection layer 7 are stacked in this order from the anode 3 side to the cathode 8 side is interposed.

The entirety of the light-emitting element 1 is provided on a substrate 2 and sealed with a sealing member 9.

In such a light-emitting element 1, by applying a driving voltage to the anode 3 and the cathode 8, an electron is supplied (injected) to the light-emitting layer 5 from the cathode 8 side, and also a hole is supplied (injected) to the light-emitting layer 5 from the anode 3 side. Then, the hole and the electron and recombined in the light-emitting layer 5, and an exciton is generated by energy emitted at this recombination, and when the exciton is returned to a ground state, energy (fluorescence or phosphorescence) is emitted (light emission). In this manner, the light-emitting element 1 emits light.

Further, the light-emitting element 1 contains a light-emitting material (guest material) as described later, and therefore emits light in a near-infrared range as in a wavelength range of 700 nm or more. Incidentally, the "near-infrared range" as used herein refers to a wavelength range of 700 nm or more and 1500 nm or less.

In particular, in this light-emitting element 1, organic materials contained in the stacked body 14, that is, organic materials contained in the hole injection layer 4, the light-emitting layer 5, the second electron transport layer 6a, and the first electron transport layer 6b have a glass transition temperature Tg of 135° C. or higher or do not have a glass transition temperature.

As having been described in the above Related Art, in order to obtain stronger light, that is, a high output, it is necessary to drive the light-emitting element 1 at a larger current (density). Specifically, in order to output several mW/cm$^2$ to several tens mW/cm$^2$ using a near-infrared light-emitting element which has an external quantum efficiency (EQE) of about 1%, it is necessary to drive the light-emitting element 1 at a current density of about 0.5 A/cm$^2$ or more and 2.0 A/cm$^2$ or less.

When the light-emitting element 1 is driven at such a large current density, large Joule heat is generated between the anode 3 and the cathode 8. Due to this, the temperature of the inside of the light-emitting element 1 increases to a very high level.

On the other hand, the light-emitting element 1 is configured such that the organic materials contained in the stacked body 14 have a glass transition temperature Tg of 135° C. or higher or do not have a glass transition temperature. Due to this, even if the temperature of the inside of the light-emitting element 1 increases to a very high level, the temperature can be accurately prevented from reaching the glass transition temperature Tg of the organic materials. Therefore, the deterioration of the light-emitting element 1 can be accurately suppressed or prevented from occurring as a result of collapse of the layer structure due to the crystallization of the organic materials or the fluidization of each layer of the stacked body 14 in the entirety of the stacked body 14 because of the temperature of the inside of the light-emitting element 1 reaching the glass transition temperature Tg of the organic materials or higher. That is, the light-emitting element 1 can be configured to be able to emit light in a near-infrared range with high efficiency and long life even if it is driven at a large current.

The substrate 2 supports the anode 3. The light-emitting element 1 of this embodiment is configured to extract light from the substrate 2 side (bottom emission type), and therefore, the substrate 2 and the anode 3 are each configured to be substantially transparent (colorless and transparent, colored and transparent, or semi-transparent).

Examples of the constituent material of the substrate 2 include resin materials such as polyethylene terephthalate, polyethylene naphthalate, polypropylene, a cycloolefin polymer, polyamide, polyether sulfone, polymethyl methacrylate, polycarbonate, and polyarylate, and glass materials such as quartz glass and soda glass, and among these, one type or two or more types in combination can be used.

The average thickness of such a substrate 2 is not particularly limited, but is preferably from about 0.1 to 30 mm, more preferably from about 0.1 to 10 mm.

In the case where the light-emitting element 1 is configured to extract light from the side opposite to the substrate 2 (top emission type), either a transparent substrate or a non-transparent substrate can be used as the substrate 2.

Examples of the non-transparent substrate include a substrate constituted by a ceramic material such as alumina, a substrate having an oxide film (insulating film) formed on the surface of a metal substrate such as stainless steel, and a substrate constituted by a resin material.

Further, in such a light-emitting element 1, the distance between the anode 3 and the cathode 8 (that is, the average thickness of the stacked body 14) is preferably from 100 to 500 nm, more preferably from 100 to 300 nm, furthermore preferably from 100 to 250 nm. According to this, the driving voltage of the light-emitting element 1 can be easily and reliably made to fall within a practical range.

Hereinafter, the respective sections constituting the light-emitting element 1 will be sequentially described.

Anode

The anode 3 is an electrode which injects holes into the hole injection layer 4. As the constituent material of the anode 3, a material having a high work function and excellent electrical conductivity is preferably used.

Examples of the constituent material of the anode 3 include oxides such as ITO (Indium Tin Oxide), IZO (Indium Zinc Oxide), $In_2O_3$, $SnO_2$, Sb-containing $SnO_2$, and Al-containing ZnO, Au, Pt, Ag, Cu, and an alloy containing any of these materials, and among these, one type or two or more types in combination can be used.

In particular, the anode 3 is preferably constituted by ITO. ITO is a material which is transparent, and also has a high work function and excellent electrical conductivity. According to this, holes can be efficiently injected from the anode 3 into the hole injection layer 4.

Further, it is preferred that the face of the anode 3 on the hole injection layer 4 side (the upper face in FIG. 1) is subjected to a plasma treatment. By doing this, the chemical and mechanical stability of the joining face of the anode 3 and the hole injection layer 4 can be increased. As a result, the property of hole injection from the anode 3 into the hole injection layer 4 can be improved. The plasma treatment will be described in detail in the explanation of the below-mentioned method for producing the light-emitting element 1.

The average thickness of such an anode 3 is not particularly limited, but is preferably from about 10 to 200 nm, more preferably from about 50 to 150 nm.

Cathode

On the other hand, the cathode 8 is an electrode which injects electrons into the electron transport layer 6 through the electron injection layer 7 described later. As the constituent material of the cathode 8, a material having a low work function is preferably used.

Examples of the constituent material of the cathode 8 include Li, Mg, Ca, Sr, La, Ce, Er, Eu, Sc, Y, Yb, Ag, Cu, Al, Cs, Rb, and an alloy containing any of these materials, and among these, one type or two or more types in combination can be used (for example, as a stacked body of a plurality of layers, a mixed layer of a plurality of types, or the like).

In particular, in the case where an alloy is used as the constituent material of the cathode 8, an alloy containing a stable metal element such as Ag, Al, or Cu, specifically, an alloy such as MgAg, AlLi, or CuLi is preferably used. By using such an alloy as the constituent material of the cathode 8, the electron injection efficiency and stability of the cathode 8 can be improved.

The average thickness of such a cathode 8 is not particularly limited, but is preferably from about 100 to 10000 nm, more preferably from about 100 to 500 nm.

Since the light-emitting element 1 of this embodiment is a bottom emission type, a light transmission property is not particularly required for the cathode 8. Further, in the case of a top emission type, since it is necessary that light be transmitted from the cathode 8 side, the average thickness of the cathode 8 is preferably from about 1 to 50 nm.

Hole Injection Layer

The hole injection layer 4 has a function to improve the hole injection efficiency from the anode 3 (that is, has a hole injection property). According to this, the light emission efficiency of the light-emitting element 1 can be increased. Here, the hole injection layer 4 also has a function to transport holes injected from the anode 3 to the light-emitting layer 5 (that is, has a hole transport property). Therefore, since the hole injection layer 4 has a hole transport property, and therefore, it can also be said that the hole injection layer 4 is a hole transport layer.

This hole injection layer 4 contains a material having a hole injection property (a hole-injecting material) as an organic material, and in this hole injection layer 4, this hole-injecting material has a glass transition temperature Tg of 135° C. or higher or does not have a glass transition temperature.

The hole-injecting material contained in this hole injection layer 4 is not particularly limited as long as it has a hole injection property and also has a glass transition temperature Tg of 135° C. or higher or does not have a glass transition temperature, and for example, a compound having a relatively large molecular weight among triarylamine-based compounds or compounds having a carbazole skeleton (a carbazole-based compound) is preferably used. Specifically, a compound which has a glass transition temperature Tg of 135° C. or higher or does not have a glass transition temperature among triarylamine-based compounds and compounds having a carbazole skeleton such as compounds represented by the following general formulae HIL-A, HIL-B, and HIL-C is preferably used.

More specifically, examples of the compound having a glass transition temperature Tg of 135° C. or higher among the compounds represented by the following general formula HIL-A include triarylamine-based compounds represented by HIL-1 to HIL-20. Further, examples of the compound having a glass transition temperature Tg of 135° C. or higher among the compounds represented by the following general formula HIL-B include carbazole-based compounds having a spiro skeleton represented by HIL-21 and HIL-22 and triarylamine-based compounds having a spiro skeleton represented by HIL-23 and HIL-24. Further, examples of the compound having a glass transition temperature Tg of 135° C. or higher among the compounds represented by the following general formula HIL-C include triarylamine-based compounds having a spiro skeleton represented by HIL-25 to HIL-27.

HIL-A

In the general formula HIL-A, X represents a biphenyl group or a p-terphenyl group; $Y_1$ to $Y_4$ each represent a biphenyl group, a p-terphenyl group, or a p-quaterphenyl group, and $Y_1$ to $Y_4$ may be the same as or different from one another.

In the case where the group X is a biphenyl group, two or more groups among $Y_1$ to $Y_4$ are preferably a p-terphenyl group or a p-quaterphenyl group, and in the case where the group X is a p-terphenyl group, $Y_1$ to $Y_4$ may be any of a biphenyl group, a p-terphenyl group, and a p-quaterphenyl group.

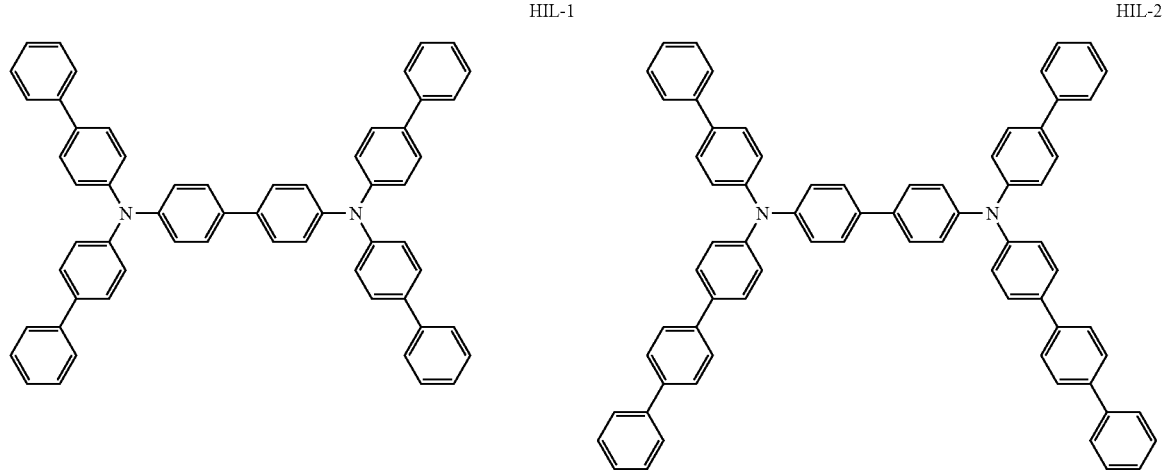

HIL-1    HIL-2

HIL-3
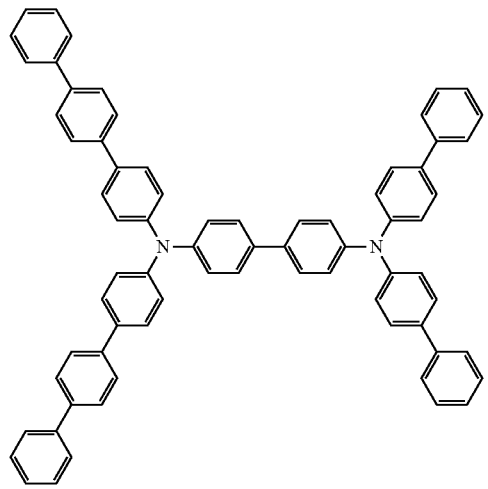
HIL-4
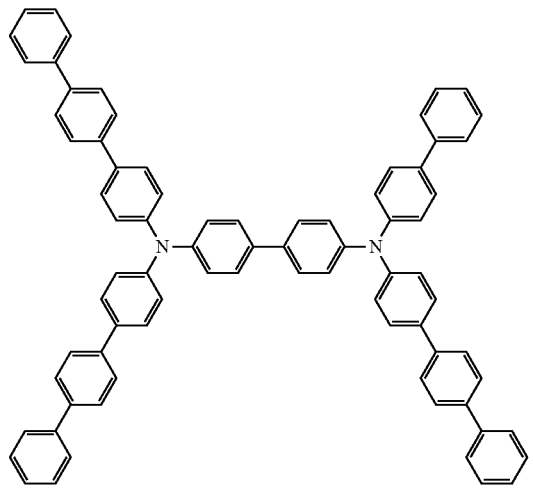
HIL-5
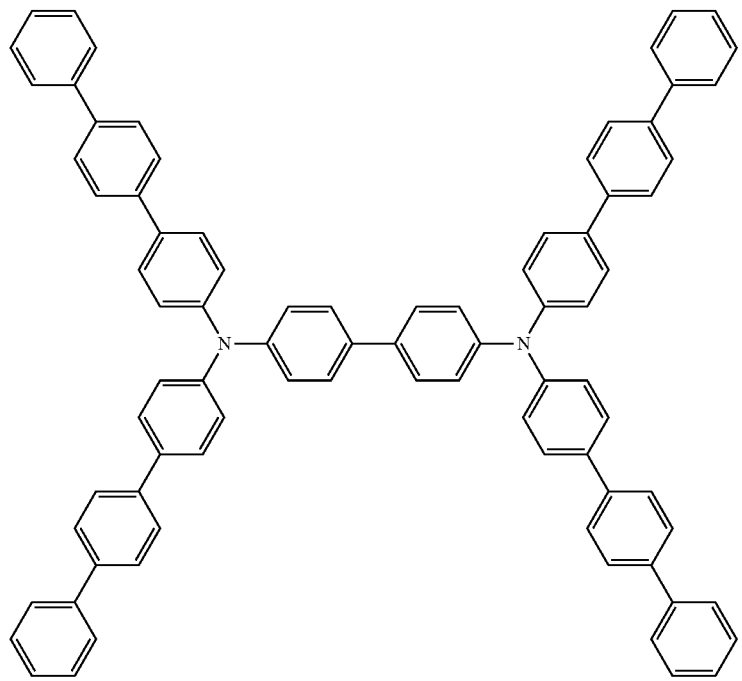
HIL-6
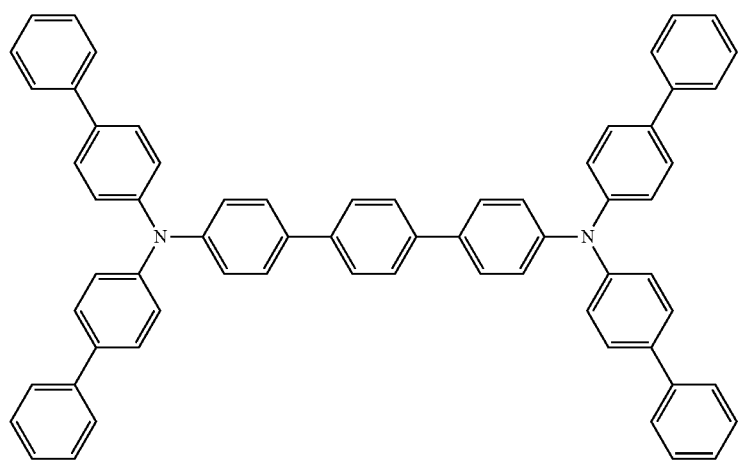

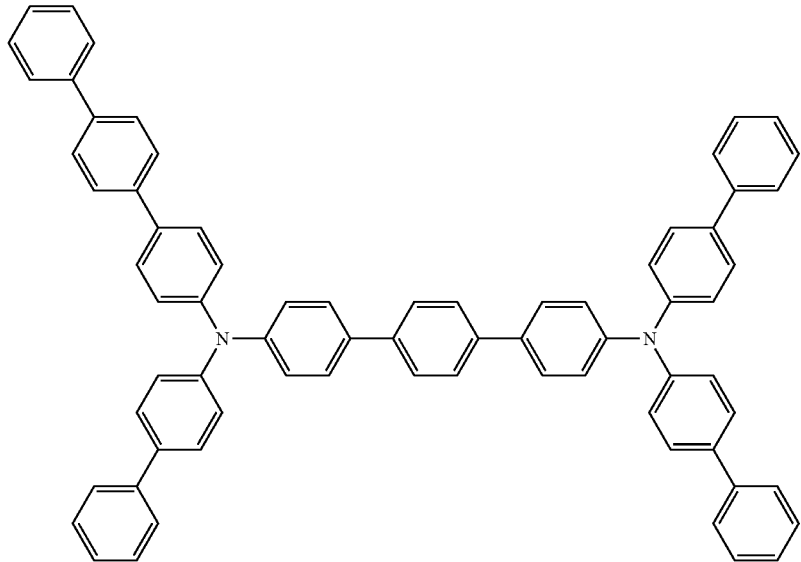
HIL-7
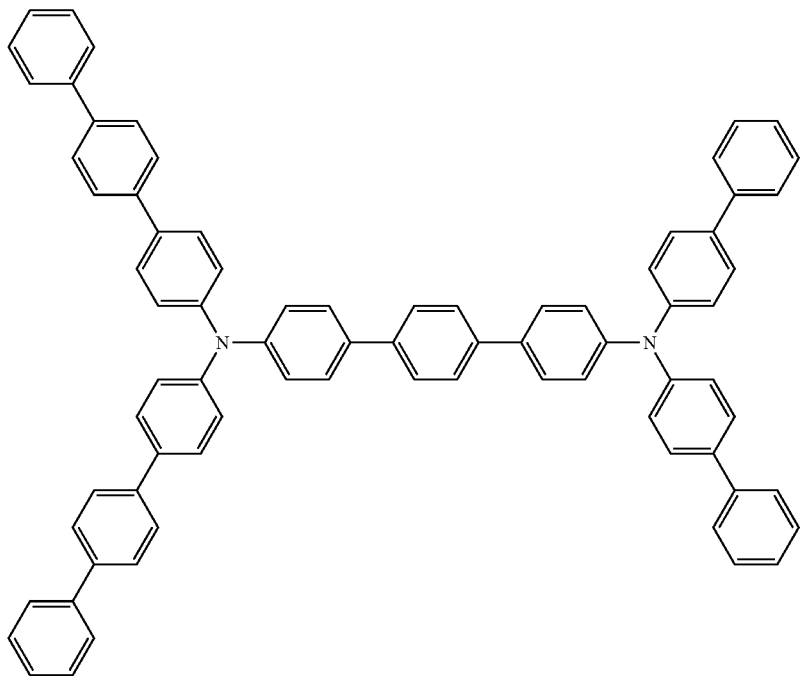
HIL-8

-continued
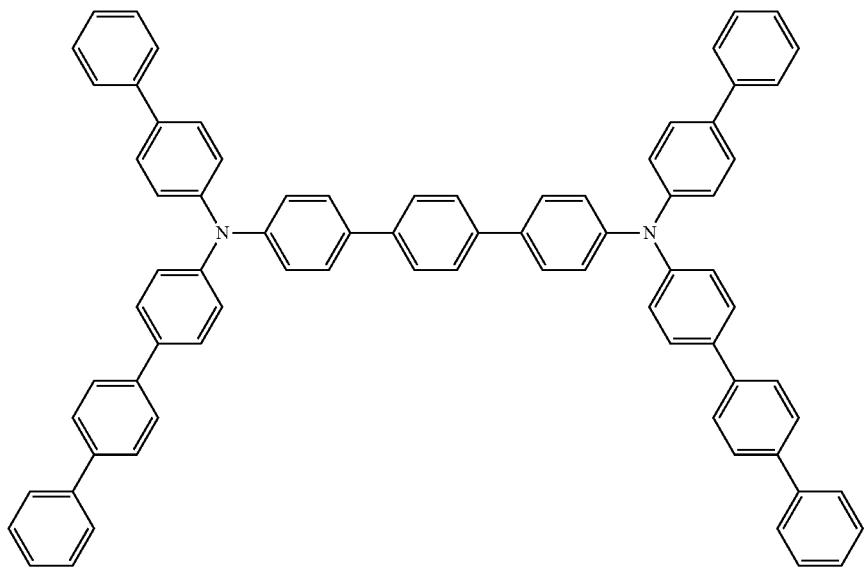
HIL-9
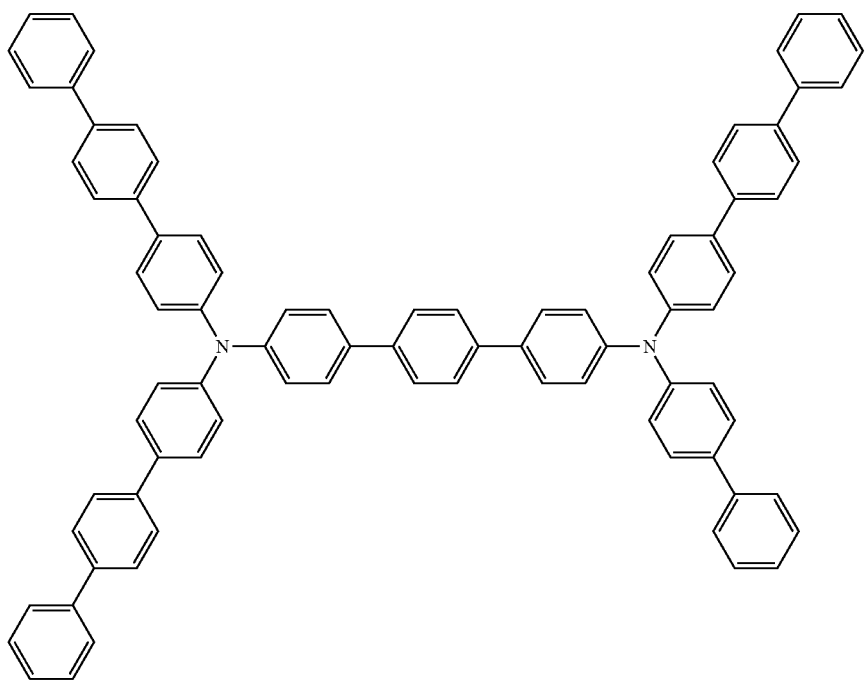
HIL-10

-continued
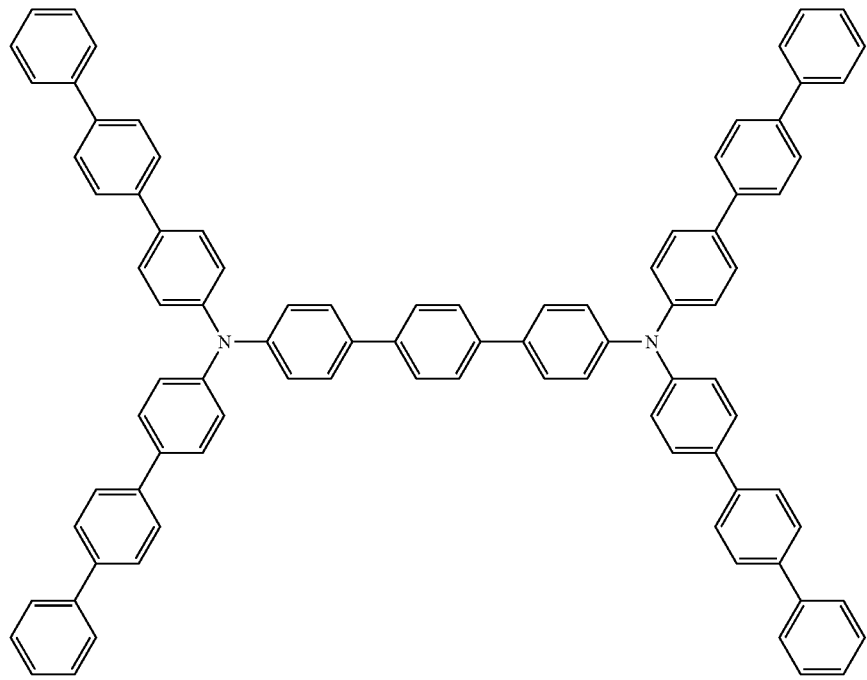
HIL-11
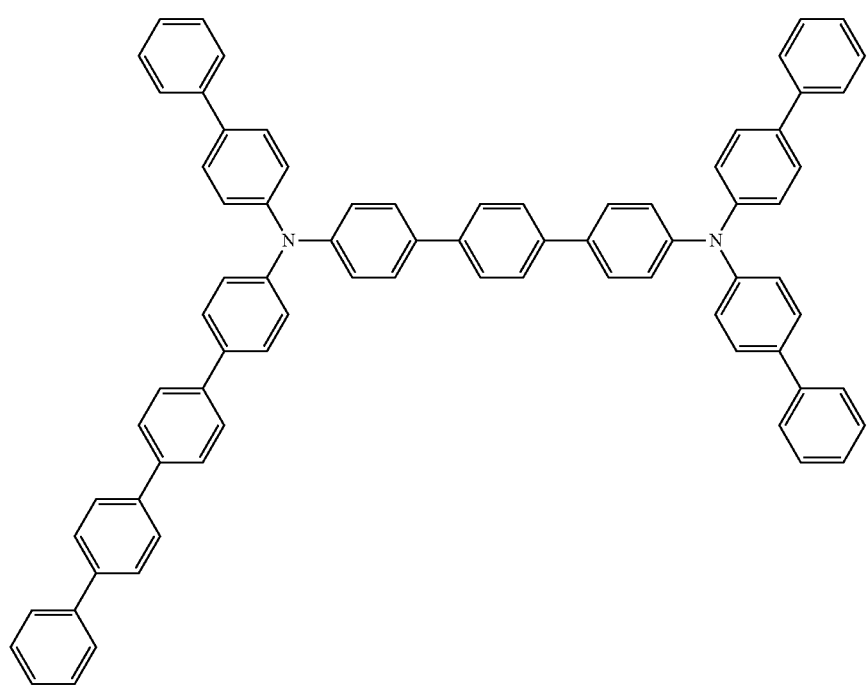
HIL-12

HIL-13
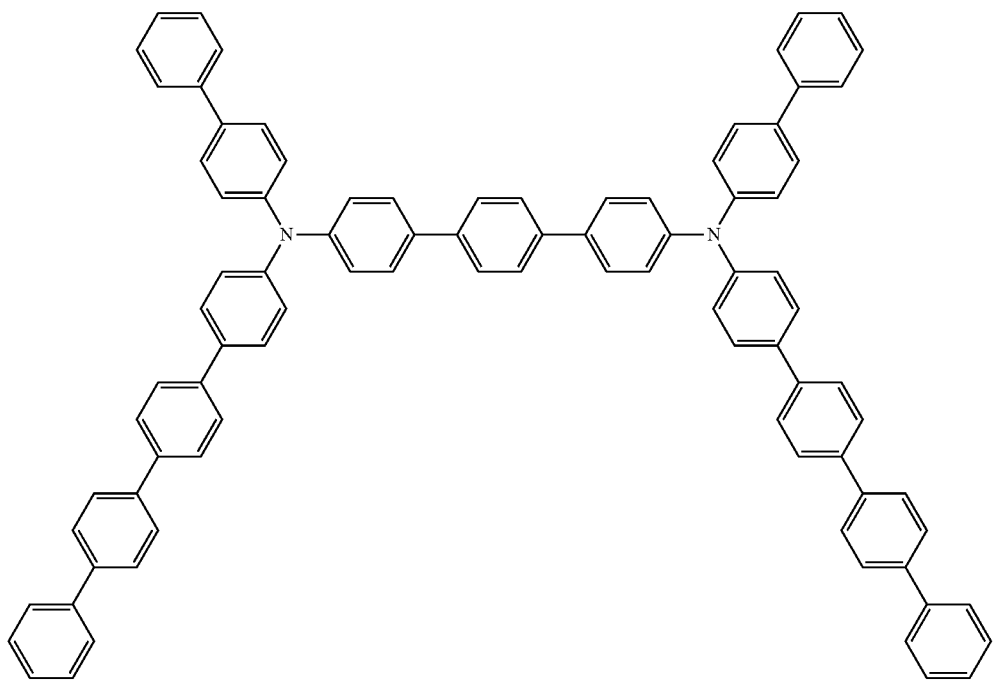
HIL-14
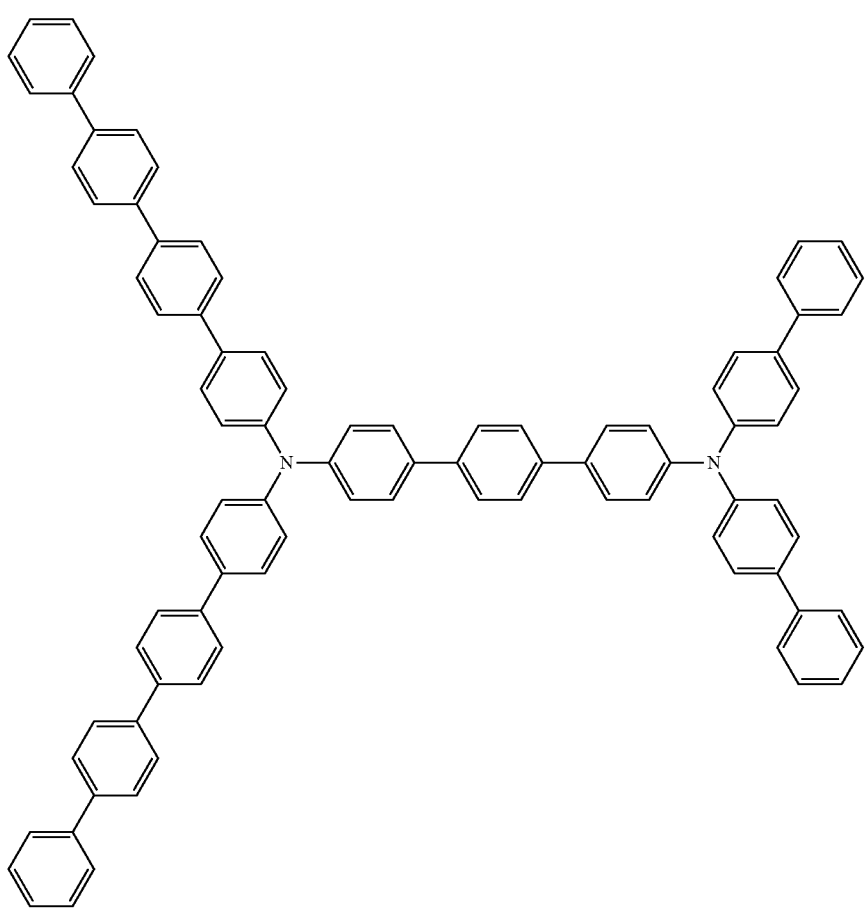

-continued
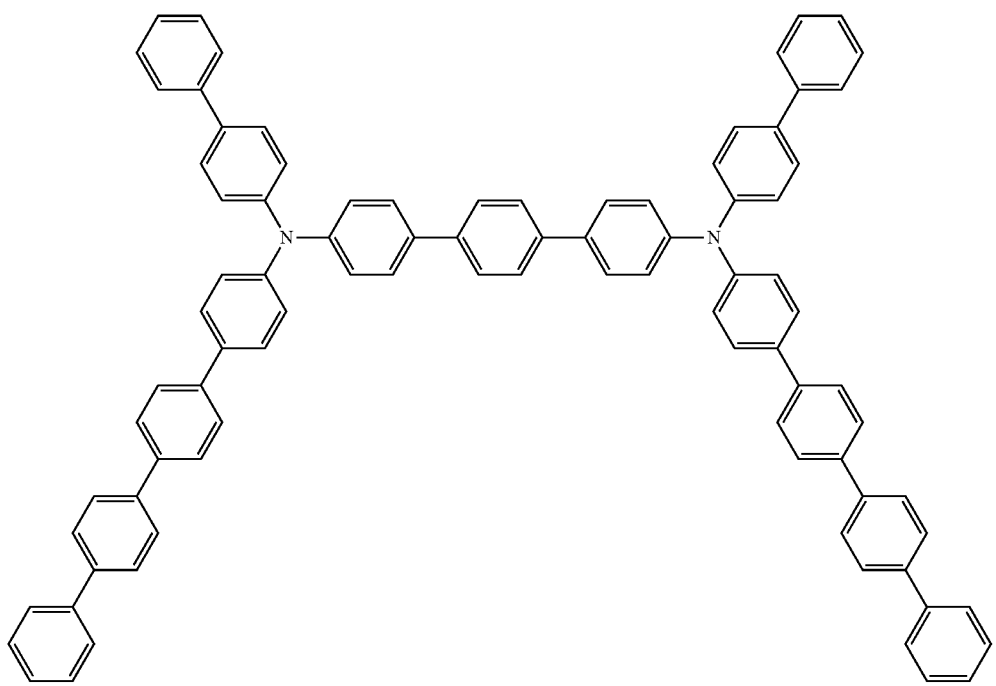
HIL-15
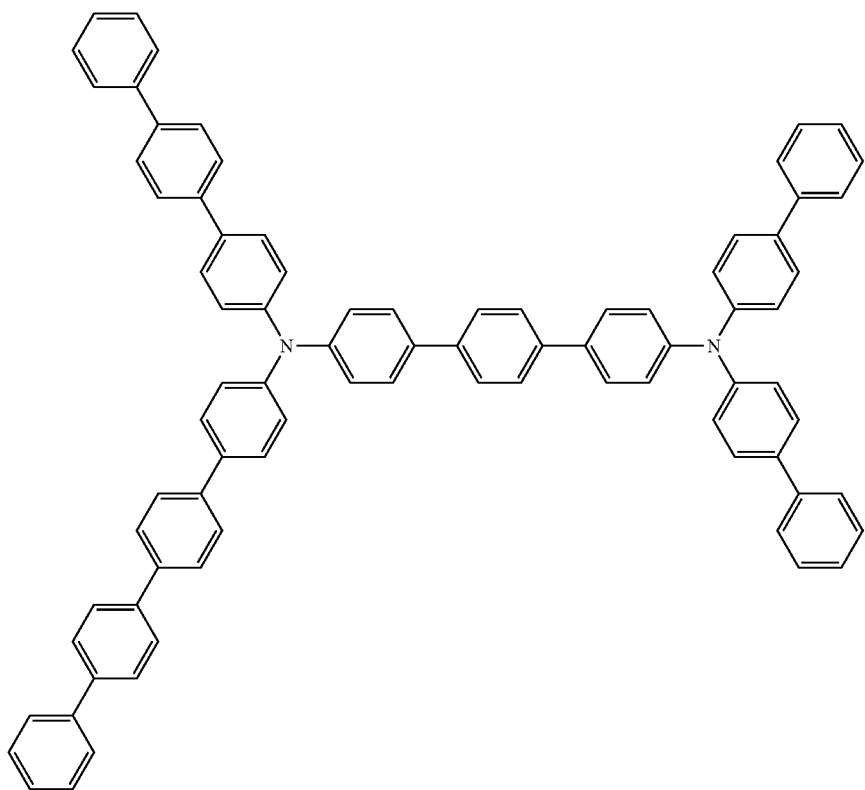
HIL-16

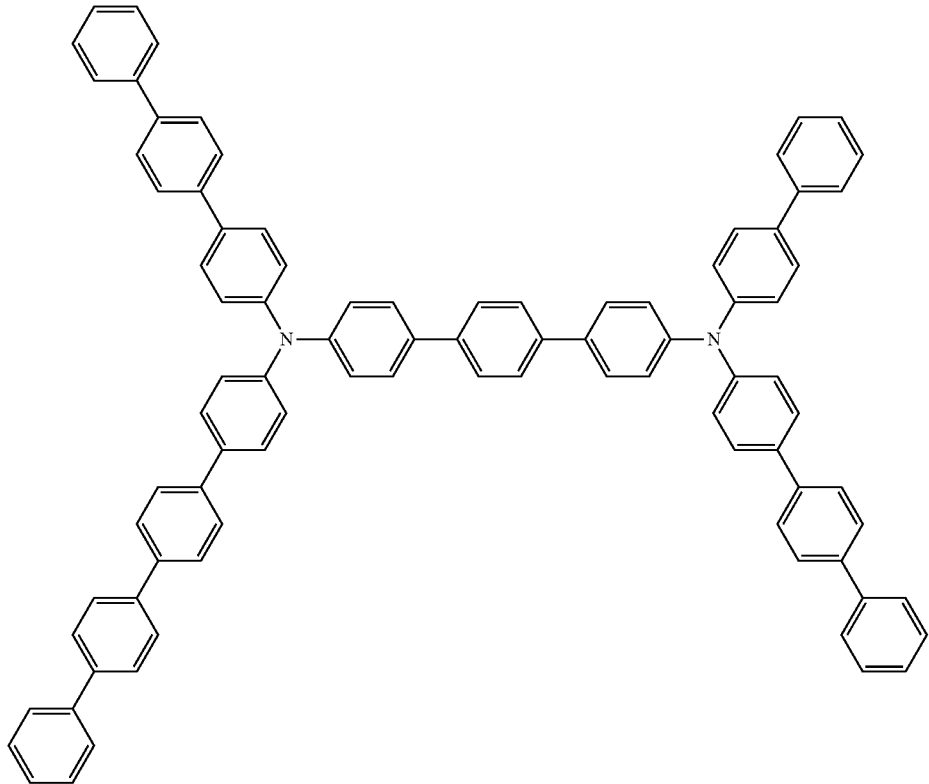
HIL-17
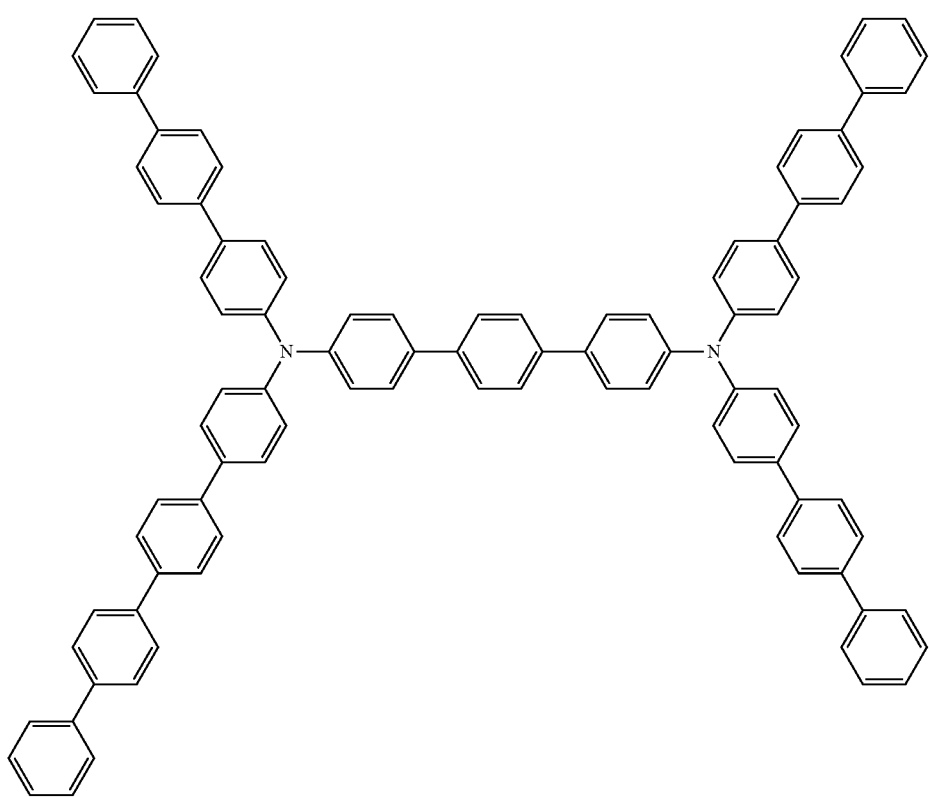
HIL-18

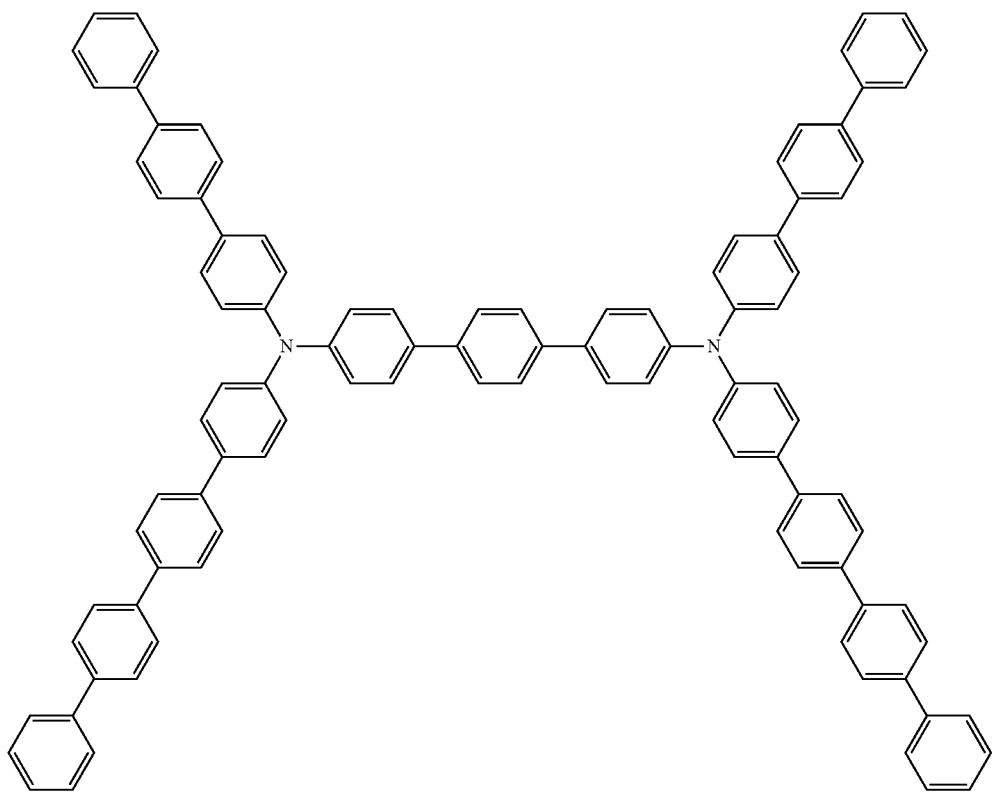
HIL-19
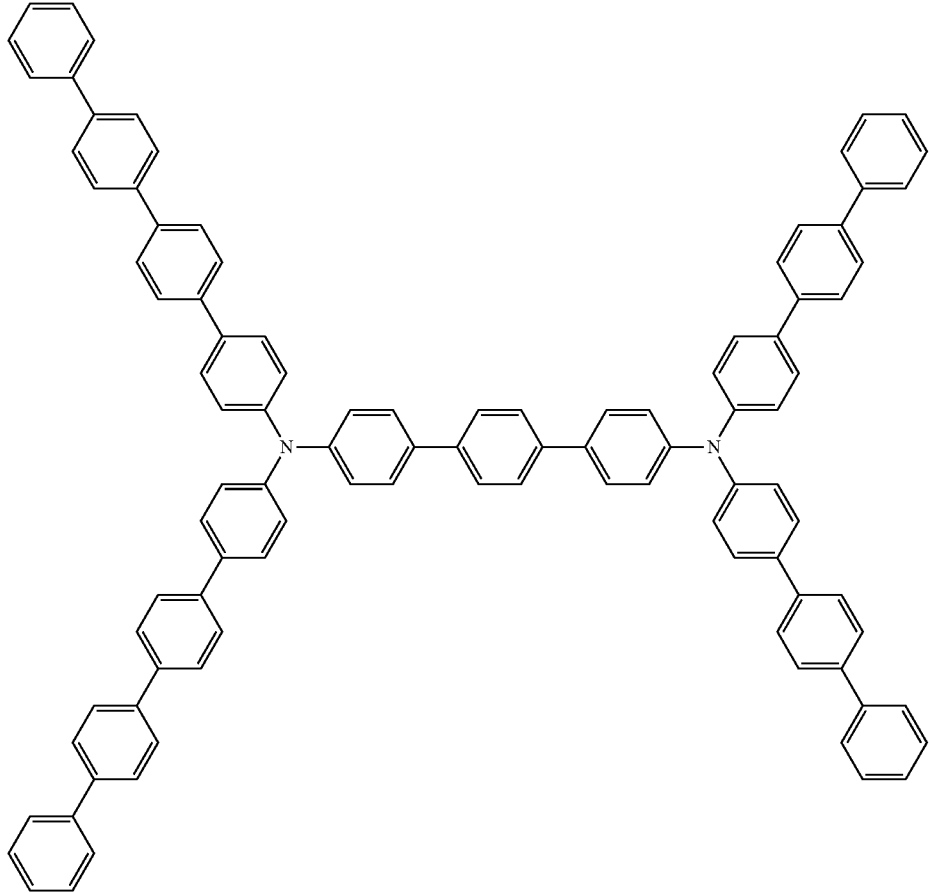
HIL-20

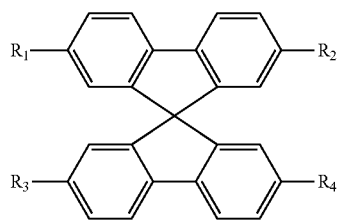
In the general formula HIL-B, $R_1$ to $R_4$ each represent a hydrogen atom, an arylamino group, or a carbazolyl group, and $R_1$ to $R_4$ may be the same as or different from one another.
HIL-21
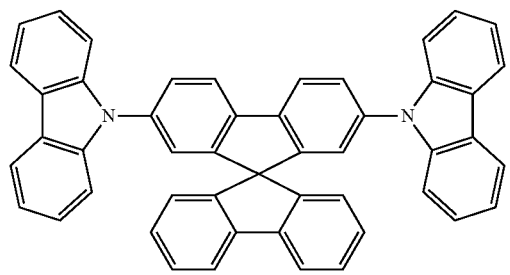
HIL-22
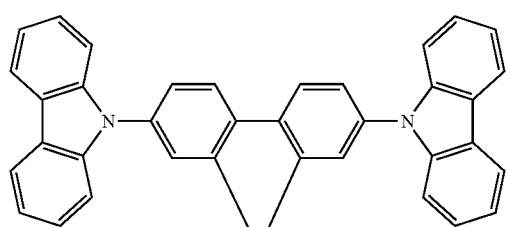
HIL-23
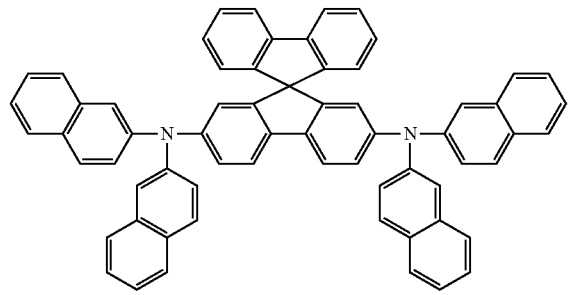
HIL-B
HIL-24
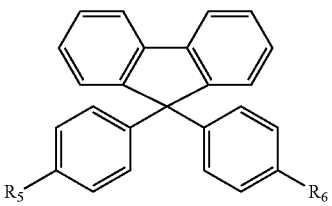
HIL-C
In the general formula HIL-C, $R_5$ and $R_6$ each represent an arylamino group or a carbazolyl group, and $R_5$ and $R_6$ may be the same as or different from each other.
HIL-25
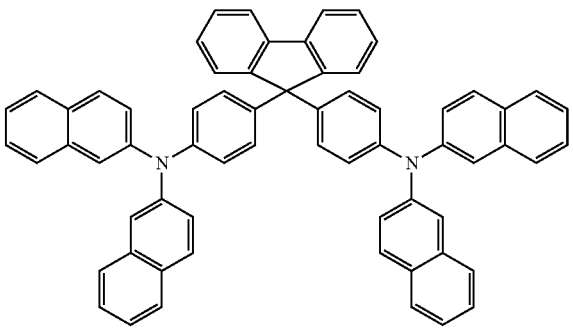

-continued

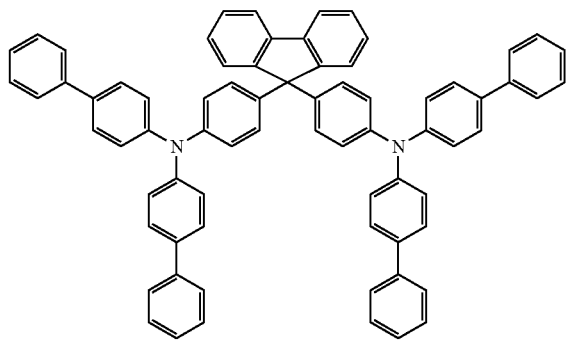
HIL-26

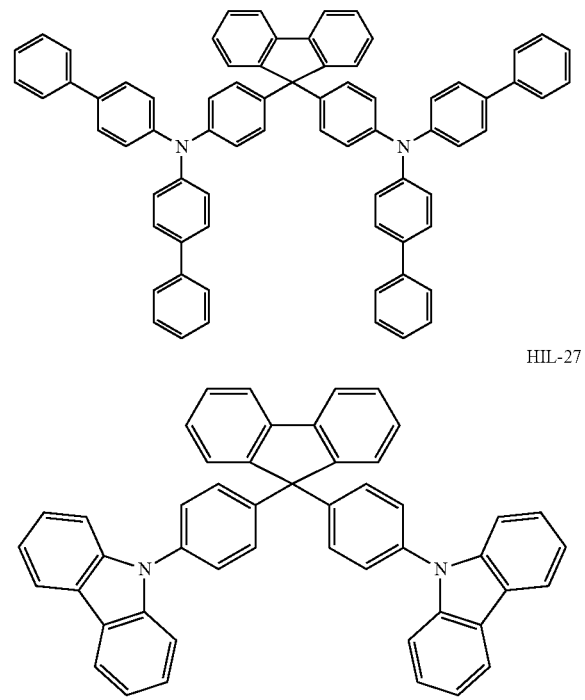
HIL-27

The organic material (hole-injecting material) contained in the hole injection layer 4 may be any as long as the glass transition temperature Tg thereof is 135° C. or higher, but is preferably 145° C. or higher, more preferably 170° C. or higher. According to this, the deterioration of the hole injection layer 4 can be more accurately suppressed or prevented, and therefore, the decrease in the light emission efficiency of the light-emitting element 1 caused thereby can be more accurately suppressed or prevented.

Further, it is preferred that a difference between the LUMO of the constituent material (the material having a hole injection property) of the hole injection layer 4 and the LUMO of a host material used in the light-emitting layer 5 is 0.5 eV or more. According to this, electrons can be prevented from passing through the light-emitting layer 5 to the hole injection layer 4, and thus, the light emission efficiency can be increased.

Further, the HOMO of the constituent material of the hole injection layer 4 is preferably 4.7 eV or more and 5.6 eV or less, and the LUMO of the constituent material of the hole injection layer 4 is preferably 2.2 eV or more and 3.0 eV or less.

In addition, the hole injection layer 4 is preferably configured to further contain at least one of a first anthracene-based compound and a second anthracene-based compound contained in the electron transport layer 6 described later other than the material having a hole injection property (hole-injecting material). According to this, even if an electron passes through the light-emitting layer 5 and is injected into the hole injection layer 4, the electron can be transported by the first anthracene-based compound or the second anthracene-based compound, and therefore, alteration or deterioration of the material having a hole injection property due to the injected electron can be suppressed or prevented. As a result, the life of the light-emitting element 1 can be extended.

The average thickness of such a hole injection layer 4 is not particularly limited, but is preferably from about 5 to 90 nm, more preferably from about 10 to 70 nm.

Incidentally, between the hole injection layer 4 and the light-emitting layer 5, a hole transport layer constituted by an organic material (for example, an amine-based compound such as a benzidine derivative) which is different from that of the hole injection layer 4 may be separately provided. In this case, this organic material is also constituted by a material which has a glass transition temperature Tg of 135° C. or higher or does not have a glass transition temperature.

Light-Emitting Layer

The light-emitting layer 5 emits light by conducting electricity between the above-mentioned anode 3 and cathode 8.

The light-emitting layer 5 is provided for obtaining light emission in a wavelength range of 700 nm or more (in a near-infrared range), and is configured to contain as organic materials, a light-emitting material (guest material) which functions as a light-emitting dopant and a host material to which this light-emitting material is added (carried) as the guest material (dopant).

In the light-emitting layer 5 having such a configuration, the light-emitting material and the host material are organic materials which have a glass transition temperature Tg of 135° C. or higher or do not have a glass transition temperature.

Among these materials, examples of the light-emitting material include thiadiazole-based compounds which are compounds represented by the following general formula (IRD1) (hereinafter also simply referred to as "thiadiazole-based compounds"), benzo-bis-thiadiazole-based compounds, and pyrromethene-based boron complexes. Among these, compounds which have a glass transition temperature Tg of 135° C. or higher or do not have a glass transition temperature are used alone or in combination of two or more types. According to this, the light-emitting layer 5 can emit light in a wavelength range of 700 nm or more (in a near-infrared range).

Among these, a thiadiazole-based compound which is a compound represented by the following general formula (IRD1) is preferred. The thiadiazole-based compound is preferably used because a thiadiazole-based compound having a glass transition temperature Tg of 135° C. or higher is relatively easily available.

As the thiadiazole-based compound, specifically, among compounds represented by the following general formulae IRD1-A, IRD1-B, IRD1-C, and IRD1-D, a compound which has a glass transition temperature Tg of 135° C. or higher or does not have a glass transition temperature is preferably used.

More specifically, examples of the compound having a glass transition temperature Tg of 135° C. or higher among the compounds represented by the following general formula IRD1-A include compounds represented by the following formulae IRD1-1 to IRD1-4. In addition, examples of the compound having a glass transition temperature Tg of 135° C. or higher among the compounds represented by the following general formula IRD1-B include compounds represented by the following formulae IRD1-5 and IRD1-6. Examples of the compound having a glass transition temperature Tg of 135° C. or higher among the compounds represented by the following general formula IRD1-C include compounds represented by the following formulae IRD1-7 to IRD1-9. Further, examples of the compound having a glass transition temperature Tg of 135° C. or higher among the compounds represented by the following general formula IRD1-D include compounds represented by the following formulae IRD1-10 to IRD1-12.

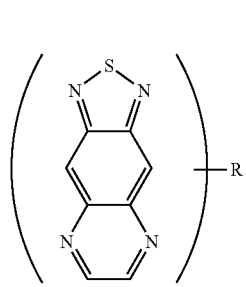

(IRD1)

In the above general formula (IRD1), R's each independently represent an aryl group, an arylamino group, a triarylamino group, or a group containing at least one of the derivatives thereof.

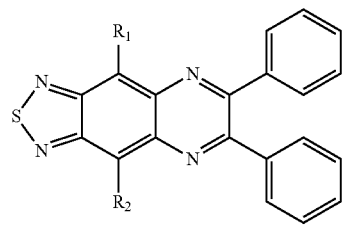

IRD1-A

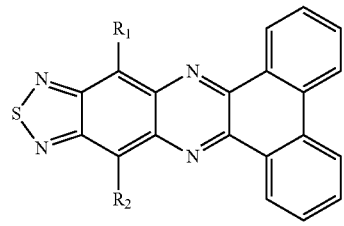

IRD1-B

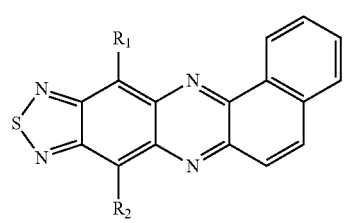

IRD1-C

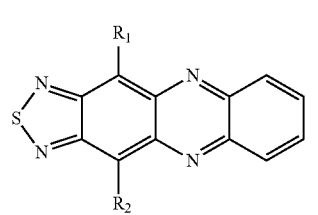

IRD1-D

In each of the above formulae IRD1-A to IRD1-D, $R_1$ and $R_2$ each represent an aryl group, an arylamino group, or a triarylamino group, and $R_1$ and $R_2$ may be the same as or different from each other.

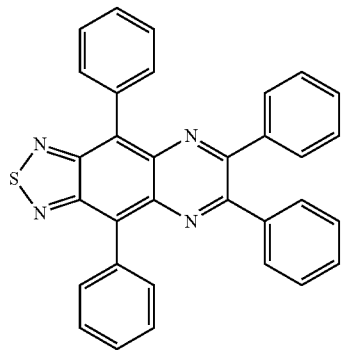

IRD1-1

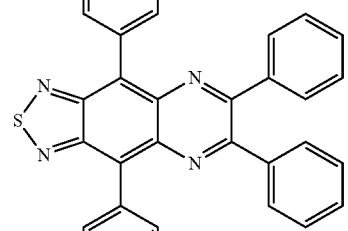

IRD1-2

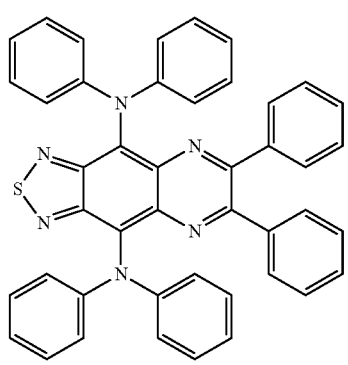

IRD1-3

IRD1-4
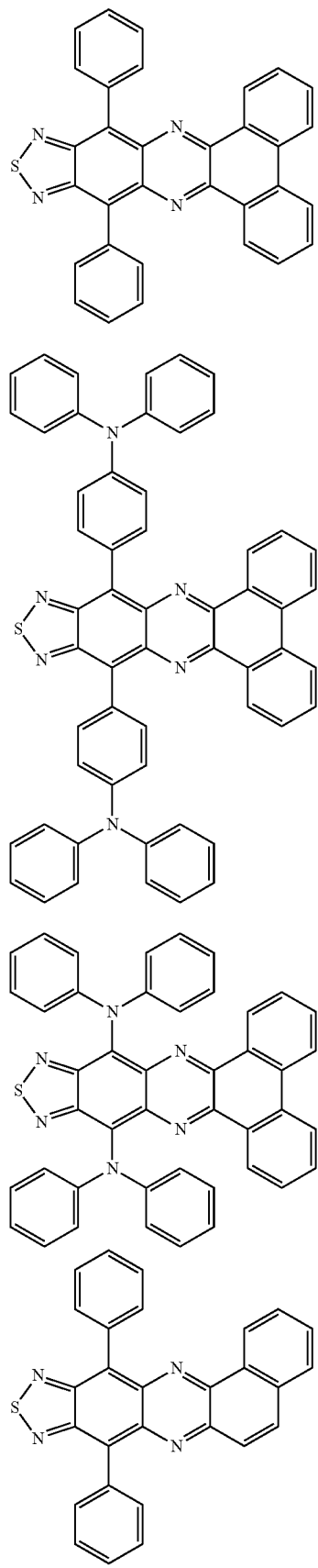
IRD1-5
IRD1-6
IRD1-7
IRD1-8
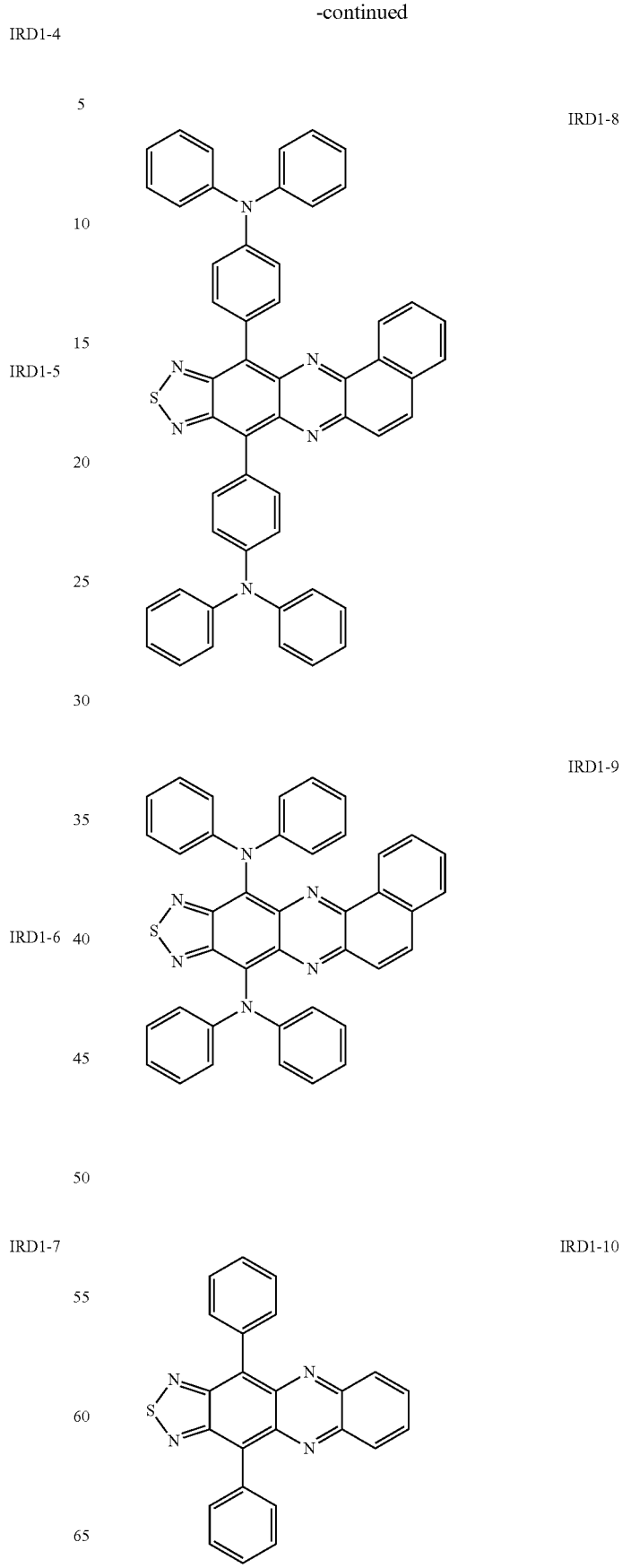
IRD1-9
IRD1-10

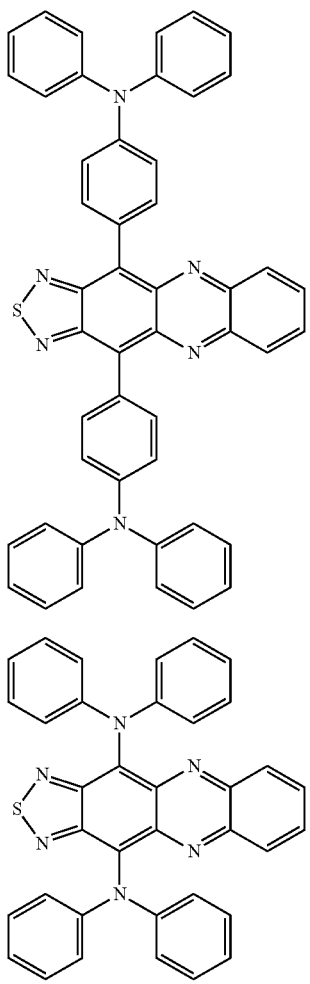

IRD1-11

IRD1-12

The light-emitting layer 5 may contain a light-emitting material (any of various types of fluorescent materials and various types of phosphorescent materials) other than the above-mentioned light-emitting material as long as is has a glass transition temperature Tg of 135° C. or higher.

Further, the light-emitting layer 5 may be a layer which emits light in a wavelength range of 700 nm or more (in a near-infrared range) by selecting the type of the light-emitting material, but is preferably a layer which emits light in a wavelength range of 700 nm or more and 1300 nm or less. The invention is more preferably applied to the light-emitting element 1 including the light-emitting layer 5 which emits light in such a wavelength range.

The host material contained as the organic material in the light-emitting layer 5 has a function to recombine a hole and an electron to generate an exciton, and also to transfer the energy of the exciton (Forster-transfer or Dexter-transfer) to the light-emitting material to excite the light-emitting material. Due to this, the light emission efficiency of the light-emitting element 1 can be increased. Such a host material can be used by, for example, being doped with the light-emitting material which is a guest material as a dopant.

Also, as the host material, a material which has a glass transition temperature Tg of 135° C. or higher or does not have a glass transition temperature is used in the same manner as the light-emitting material, and for example, among tetracene-based compounds which are compounds represented by the following formula IRH-1, a compound which has a glass transition temperature Tg of 135° C. or higher or does not have a glass transition temperature is particularly preferably used.

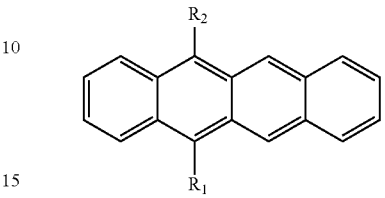

IRH-1

In the above general formula IRH-1, $R_1$ and $R_2$ each represent a hydrogen atom, an alkyl group, an aryl group which may have a substituent, or an arylamino group, and $R_1$ and $R_2$ may the same as or different from each other.

The various types of compounds (benzo-bis-thiadiazole-based compounds) exemplified as the light-emitting material as described above have high polarity (large polarization), and therefore, in the case where such a compound is used as the light-emitting material, when the concentration thereof in the light-emitting layer is high, concentration quenching which is a phenomenon in which light emission efficiency is decreased due to the interaction between the molecules of the light-emitting material is likely to occur.

On the other hand, the tetracene-based compound has low polarity (small polarization). Therefore, by using the tetracene-based compound as the host material, the interaction between the molecules of the light-emitting material as described above is reduced, and therefore, the concentration quenching property can be reduced.

On the other hand, for example, in the case where $Alq_3$ having high polarity (large polarization) is used as the host material, the polarity of both of the host material and the light-emitting material is high (the polarization is large), and therefore, the interaction between the molecules of the light-emitting material is likely to occur, and thus, the concentration quenching property is increased.

Further, an anthracene-based compound which is an acene-based compound in the same manner as the tetracene-based compound has an effect of reducing the concentration quenching property in the case where it is used as the host material, however, the light emission efficiency is decreased as compared with the case where the tetracene-based compound is used as the host material. It is considered to be because when the anthracene-based compound is used as the host material, the energy transfer from the host material to the light-emitting material is not sufficient, and the probability that an electron injected into the LUMO of the host material penetrates on the anode side is high. Due to this, it cannot be said that the anthracene-based compound is suitable as the host material. Incidentally, such a phenomenon occurs in the same manner also in the case of a pentacene-based compound other than the anthracene-based compound.

For this reason, by using the tetracene-based compound (acene-based compound) as the host material, the light emission efficiency of the light-emitting element 1 can be increased, and therefore, the tetracene-based compound is favorably used as the host material.

Further, the tetracene-based compound has excellent resistance to electrons and holes. In addition, the tetracene-based compound also has excellent thermal stability. Due to this, the life of the light-emitting element 1 can be extended. Further, since the tetracene-based compound has excellent thermal stability, in the case where the light-emitting layer is formed using a gas phase deposition method, the decomposition of the host material due to heat during deposition can be prevented. As a result, the light-emitting layer having excellent film quality can be formed. In addition, a material which has a glass transition temperature Tg of 135° C. or higher or does not have a glass transition temperature can be relatively easily selected. As a result, also from this point of view, the light emission efficiency of the light-emitting element 1 can be increased and also the life thereof can be extended.

In addition, the tetracene-based compound hardly emits light itself, and therefore, it is also possible to prevent the emission spectrum of the light-emitting element 1 from being adversely affected by the host material.

Examples of such a tetracene-based compound having a glass transition temperature Tg of 135° C. or higher include compounds represented by the following formulae H-1 to H-10 among the compounds represented by the above general formula IRH-1.

The tetracene-based compounds represented by the following formulae H-1 to H-10 are constituted by a carbon atom and a hydrogen atom, and therefore, the polarity of the host material can be decreased, and thus, an undesirable interaction between the host material and the light-emitting material can be prevented from occurring. Due to this, the light emission efficiency of the light-emitting element 1 can be increased. In addition, the resistance of the host material to electrons and holes can be increased. As a result, the life of the light-emitting element 1 can be extended.

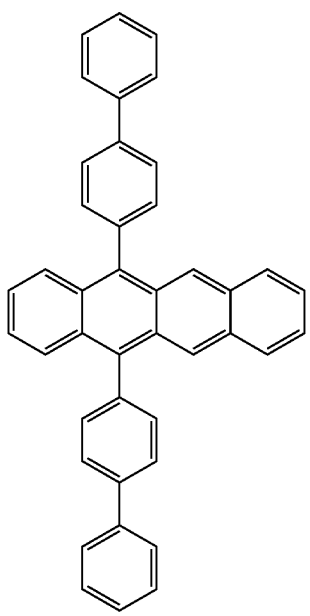

H-1

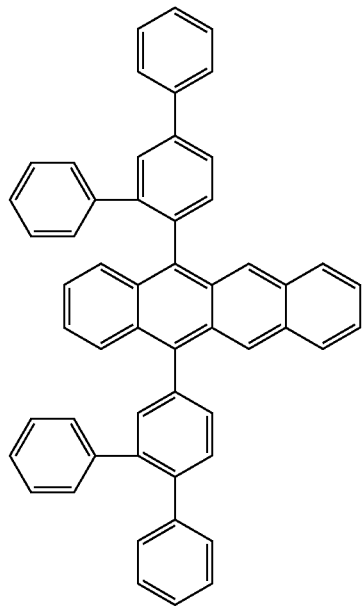

H-2

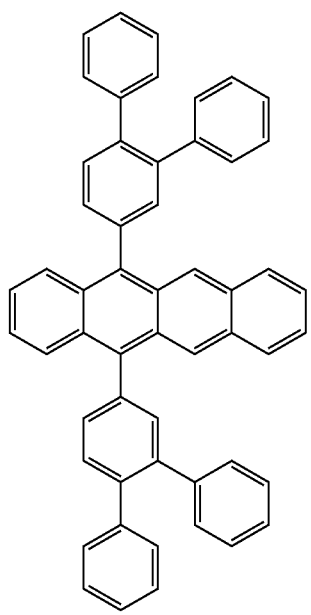

H-3

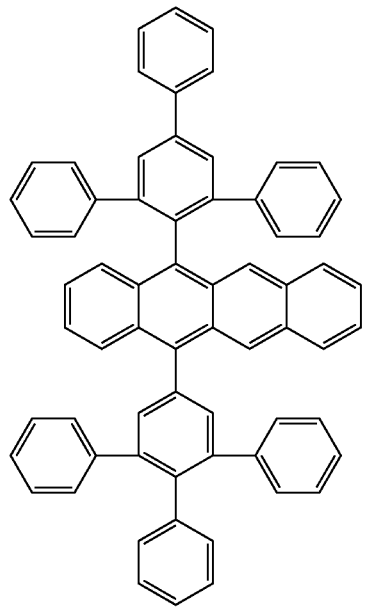
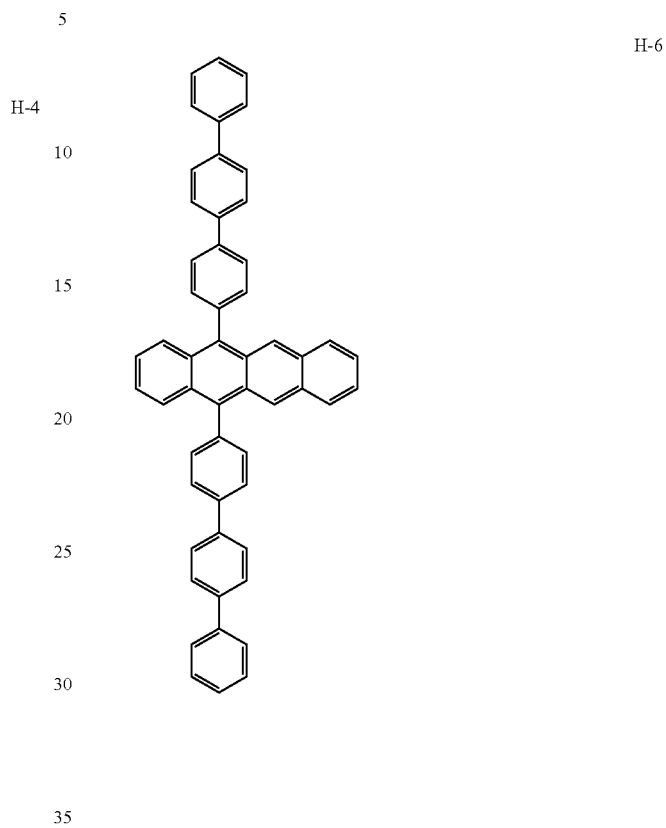
H-4
H-6
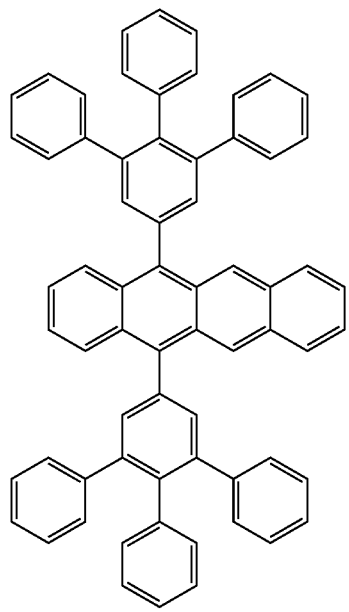
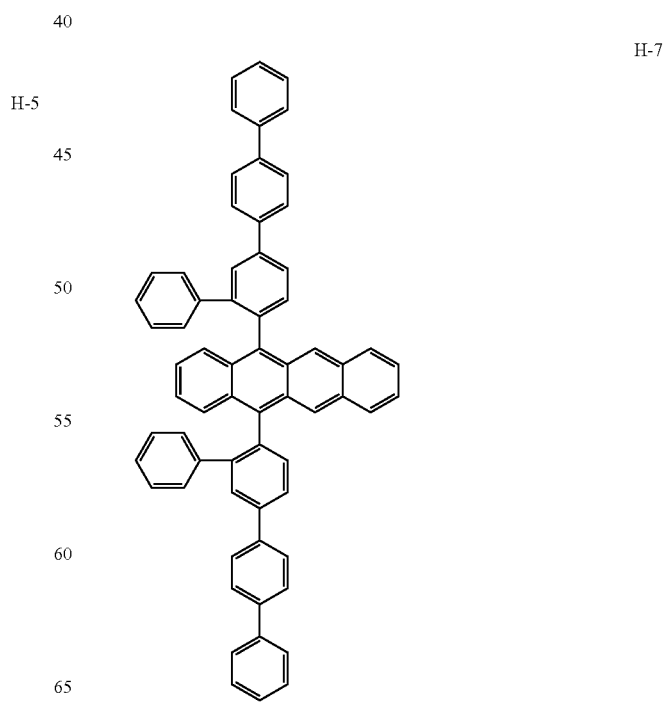
H-5
H-7

H-8

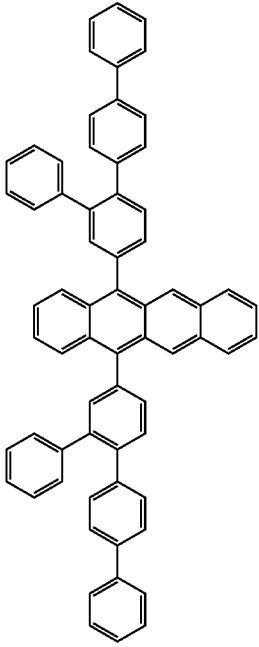

H-9

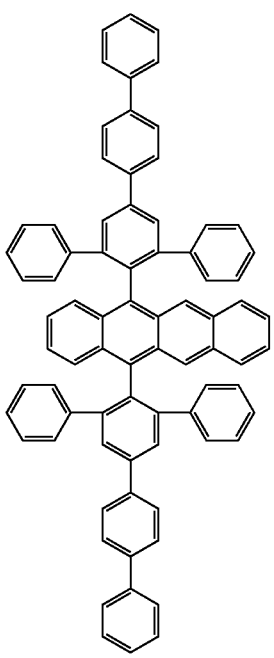

H-10

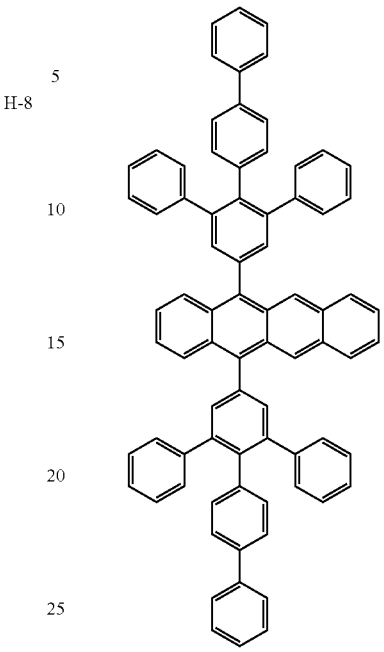

The light-emitting material and the host material contained in the light-emitting layer 5 as the organic materials may be any as long as the glass transition temperature Tg of each material is 135° C. or higher, but is preferably 145° C. or higher, more preferably 170° C. or higher. According to this, the deterioration of the light-emitting layer 5 can be more accurately suppressed or prevented from occurring, and therefore, the decrease in the light emission efficiency of the light-emitting element 1 caused thereby can be more accurately suppressed or prevented.

Further, the HOMO of the host material used in the light-emitting layer 5 is preferably 5.0 eV or more and 5.8 eV or less, and the LUMO of the constituent material of the hole injection layer 4 is preferably 2.5 eV or more and 3.6 eV or less.

The content (doping amount) of the light-emitting material in the light-emitting layer 5 containing such a light-emitting material and a host material is preferably 0.25 wt % or more and 5.0 wt % or less, more preferably 0.5 wt % or more and 2.0 wt % or less, further more preferably 1.0 wt % or more and 2.0 wt % or less. According to this, an excellent balance between the light emission efficiency and the life of the light-emitting element 1 can be achieved.

The average thickness of the light-emitting layer 5 is preferably 5 nm or more and 50 nm or less, more preferably from 25 nm or more and 50 nm or less. According to this, while reducing the driving voltage of the light-emitting element 1, the life of the light-emitting element 1 can be extended.

Electron Transport Layer

The electron transport layer 6 is provided between the light-emitting layer 5 and the electron injection layer 7, and has a function to transport electrons injected from the cathode 8 through the electron injection layer 7 to the light-emitting layer 5.

In this invention, as shown in FIG. 1, this electron transport layer 6 includes the first electron transport layer 6b located on the cathode 8 side and the second electron transport layer 6a located on the light-emitting layer 5 side.

That is, the electron transport layer 6 includes the first electron transport layer 6b and the second electron transport layer 6a provided between the first electron transport layer 6b and the light-emitting layer 5.

First Electron Transport Layer

In this embodiment, the first electron transport layer 6b contains a first anthracene-based compound having an anthracene skeleton and a nitrogen-containing heterocyclic skeleton as the organic material, and in the first electron transport layer 6b, this first anthracene-based compound has a glass transition temperature Tg of 135° C. or higher or does not have a glass transition temperature.

Here, the compound having an anthracene skeleton is a compound having an excellent electron transport property. Further, the compound having a nitrogen-containing heterocyclic skeleton is a compound having an excellent property of electron injection from the cathode 8 through the electron injection layer 7. Due to this, by using the first anthracene-based compound having an anthracene skeleton and a nitrogen-containing heterocyclic skeleton as the constituent material of the first electron transport layer 6b provided in contact with the electron injection layer 7, the first electron transport layer 6b has both of an excellent electron transport property and an excellent property of electron injection from the cathode 8 through the electron injection layer 7. Incidentally, the first electron transport layer 6b has a function to inject electrons from the cathode 8 through the electron injection layer 7. Therefore, it can also be said that the first electron transport layer 6b is an electron injection layer because of having an electron injection property.

In the first electron transport layer 6b, the first anthracene-based compound having a nitrogen-containing heterocyclic skeleton is used as the constituent material thereof, and the first anthracene-based compound shows crystallinity because of having such a nitrogen-containing heterocyclic skeleton. On the other hand, in this embodiment, this first anthracene-based compound has a glass transition temperature Tg of 135° C. or higher or does not have a glass transition temperature. Due to this, when the light-emitting element 1 is used by repeatedly conducting electricity between the anode 3 and the cathode 8 at a current density of about 0.5 A/cm² or more and 2.0 A/cm² or less, the first anthracene-based compound shows a tendency to be crystallized in the first electron transport layer 6b. However, since a compound which has a glass transition temperature Tg of 135° C. or higher or does not have a glass transition temperature is selected as the first anthracene-based compound, the alteration or deterioration of the first electron transport layer 6b due to crystallization of the first anthracene-based compound can be accurately suppressed or prevented, and as a result, the life of the light-emitting element 1 is extended.

The average thickness of the first electron transport layer 6b is preferably less than 8 nm, more preferably 3 nm or more and 5 nm or less. By setting the average thickness of the first electron transport layer 6b thin in this manner, in the first electron transport layer 6b, even if the first anthracene-based compound shows a tendency to be crystallized, the alteration or deterioration of the first electron transport layer 6b due to crystallization can be suppressed, and also from this point of view, the life of the light-emitting element 1 is extended.

Further, even if a hole passes through the second electron transport layer 6a and is injected into the first electron transport layer 6b, since the thickness of the first electron transport layer 6b is thin, the hole further passes through the first electron transport layer 6b and disappears in the electron injection layer 7 or the cathode 8. Due to this, also from this point of view, the alteration or deterioration of the first electron transport layer 6b can be suppressed, and as a result, the life of the light-emitting element 1 is extended.

The nitrogen-containing heterocyclic skeleton is not particularly limited as long as it has a nitrogen atom in a heterocyclic ring, however, examples thereof include an azaindolizine skeleton, an oxadiazole skeleton, a pyridine skeleton, a pyrimidine skeleton, a quinoxaline skeleton, and a phenanthroline skeleton such as 2,9-dimethyl-4,7-diphenyl-1,10-phenanthroline (BCP), and above all, an azaindolizine skeleton is preferred. The azaindolizine skeleton is a skeleton having low affinity for a metal material. Therefore, the decrease in the electron transport property and the electron injection property of the first electron transport layer 6b due to the incorporation of an alkali metal, an alkaline earth metal, or the like contained in the electron injection layer 7 in contact with the first electron transport layer 6b can be suppressed or prevented.

Accordingly, as the first anthracene-based compound, a compound which has a glass transition temperature Tg of 135° C. or higher or does not have a glass transition temperature is preferably used among azaindolizine-based compounds having both of an anthracene skeleton and an azaindolizine skeleton in the molecule (hereinafter also simply referred to as "azaindolizine-based compounds"). According to this, electrons can be efficiently transported and injected into the second electron transport layer 6a over a long period of time. As a result, the light emission efficiency of the light-emitting element 1 can be increased.

The azaindolizine-based compound is preferably an azaindolizine-based compound having one or two azaindolizine skeletons and one or two anthracene skeletons in one molecule. According to this, electrons can be more efficiently transported and injected into the second electron transport layer 6a over a long period of time. As a result, the light emission efficiency of the light-emitting element 1 can be further increased.

Examples of the azaindolizine-based compound include compounds which have a glass transition temperature Tg of 135° C. or higher or do not have a glass transition temperature among compounds represented by the following general formula ETL1.

More specifically, examples of the compound having a glass transition temperature Tg of 135° C. or higher among the compounds represented by the following general formula ETL1 include compounds represented by the following formulae ETL1-1 to ETL1-18.

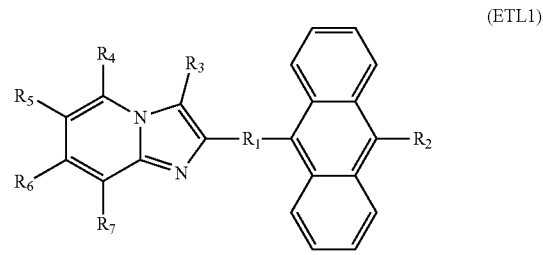

(ETL1)

In the above formula ETL1, $R_1$ to $R_7$ each independently represent a hydrogen atom, an alkyl group, an aryl group which may have a substituent, or an arylamino group, and $R_1$ to $R_7$ may be the same as or different from one another.

ETL1-1
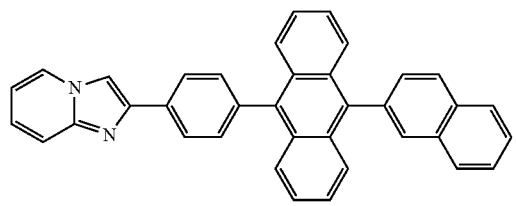
ETL1-2
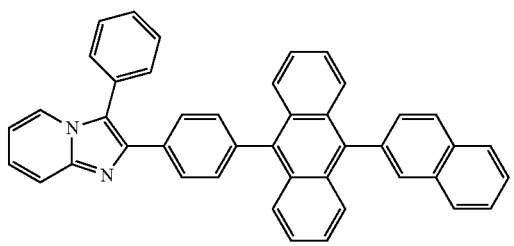
ETL1-3
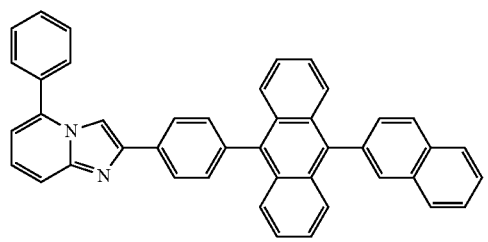
ETL1-4
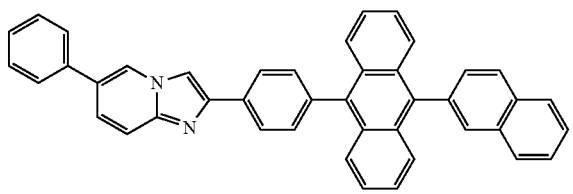
ETL1-5
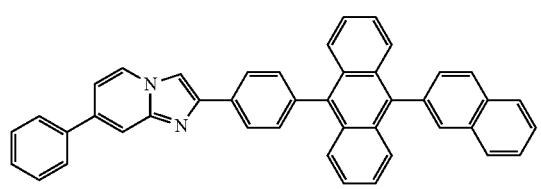
ETL1-6
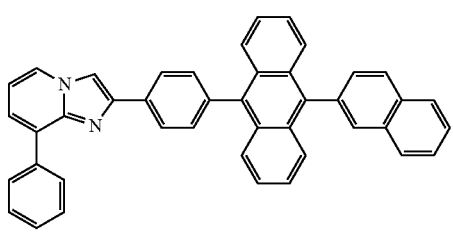
ETL1-7
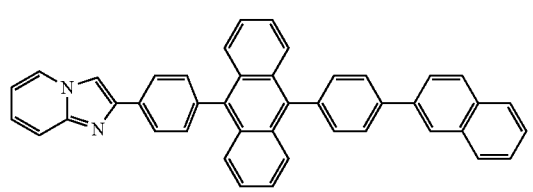
ETL1-8
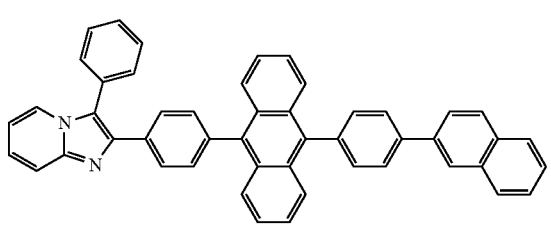
ETL1-9
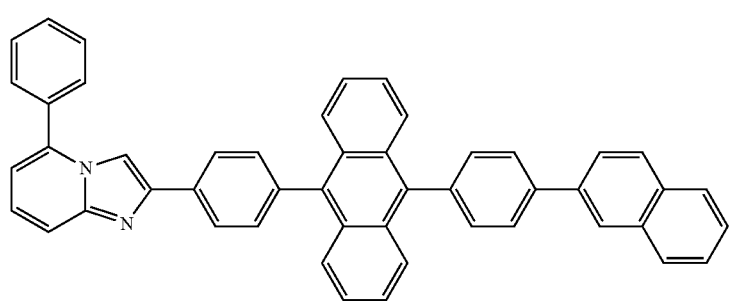
ETL1-10
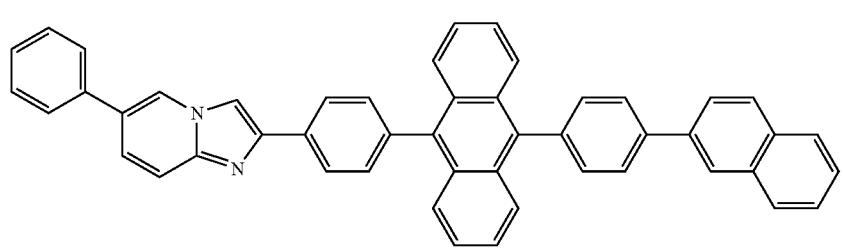

-continued
ETL1-11
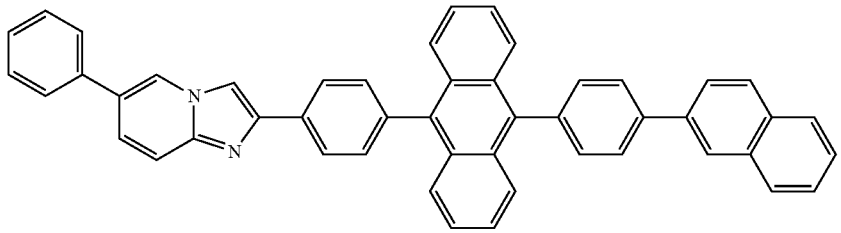
ETL1-12
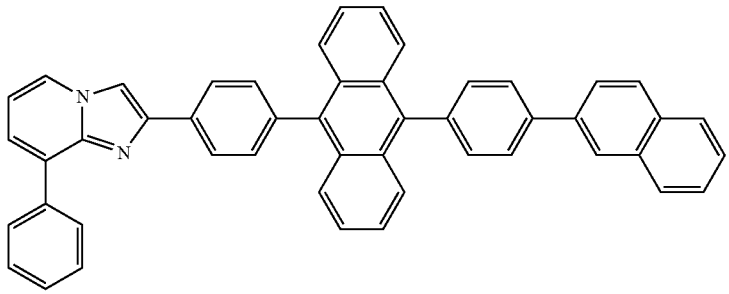
ETL1-13
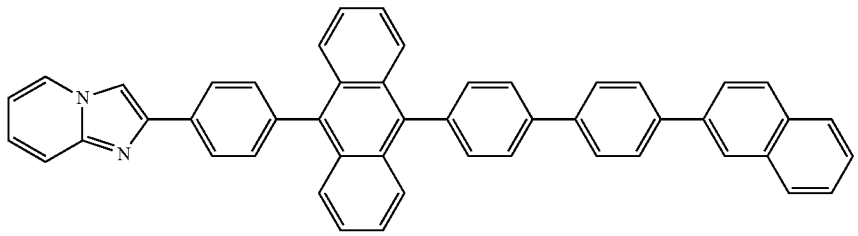
ETL1-14
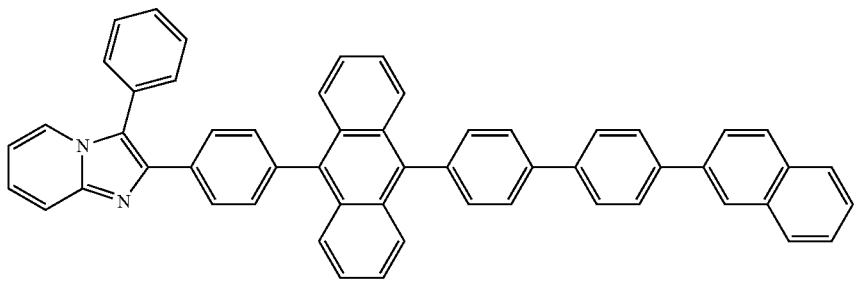
ETL1-15
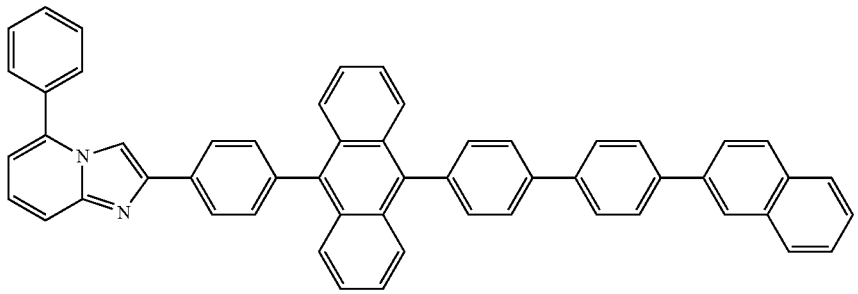
ETL1-16
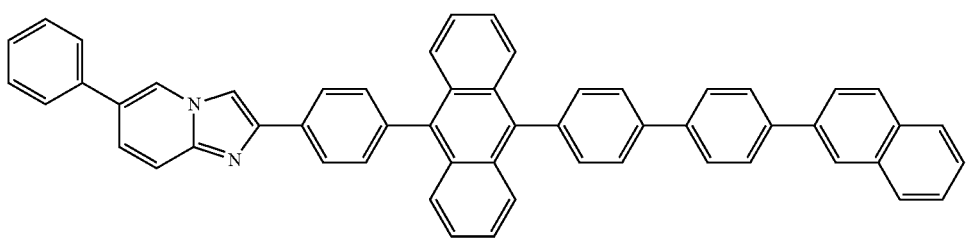

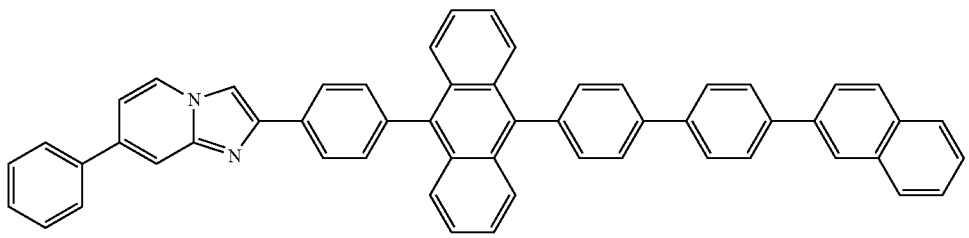

ETL1-17

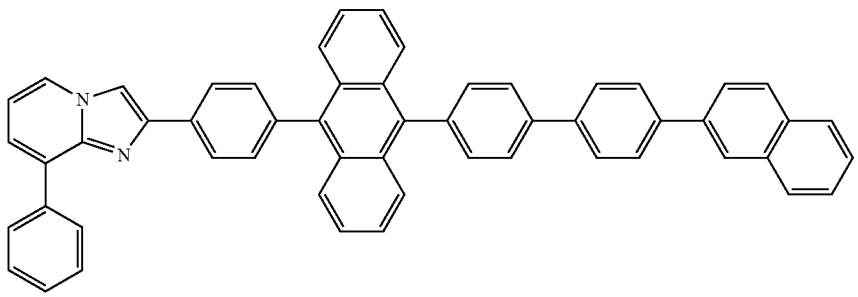

ETL1-18

Such an azaindolizine-based compound has an excellent electron transport property and an excellent electron injection property as described above, and the reason for this is considered to be as follows.

The entirety of the molecule of the azaindolizine-based compound having an azaindolizine skeleton and an anthracene skeleton in the molecule as described above is connected by a π-conjugated system, and therefore, the electron cloud is spread across the entirety of the molecule.

Then, the portion of the azaindolizine skeleton of the azaindolizine-based compound has a function to receive an electron and a function to send the received electron to the portion of the anthracene skeleton. On the other hand, the portion of the anthracene skeleton of the azaindolizine-based compound has a function to receive an electron from the portion of the azaindolizine skeleton and a function to transfer the received electron to a layer adjacent to the first electron transport layer 6b on the anode 3 side, that is, to the second electron transport layer 6a.

More specifically, the portion of the azaindolizine skeleton of the azaindolizine-based compound includes two nitrogen atoms, and one of the nitrogen atoms (on the side near the portion of the anthracene skeleton) has an $sp^2$ hybrid orbital, and the other nitrogen atom (on the side far from the portion of the anthracene skeleton) has an $sp^3$ hybrid orbital. The nitrogen atom with an $sp^2$ hybrid orbital forms a portion of the conjugated system of the azaindolizine-based compound molecule and also has higher electronegativity than a carbon atom, and thus more strongly attracts an electron, and therefore, functions as a portion that receives an electron. On the other hand, the nitrogen atom with an $sp^3$ hybrid orbital is not a normal conjugated system but has a non-covalent electron pair, and therefore, the electron of the nitrogen atom functions as a portion that sends an electron toward the conjugated system of the azaindolizine-based compound molecule.

On the other hand, the portion of the anthracene skeleton of the azaindolizine-based compound is electrically neutral, and therefore can easily receive an electron from the portion of the azaindolizine skeleton. Further, the portion of the anthracene skeleton of the azaindolizine-based compound has a large orbital overlap with the second anthracene-based compound which is the constituent material of the second electron transport layer 6a, and therefore can easily transfer an electron to the second anthracene-based compound.

Further, such an azaindolizine-based compound has an excellent electron transport property and an excellent electron injection property as described above, and as a result, the driving voltage of the light-emitting element 1 can be decreased.

Further, the portion of the azaindolizine skeleton is stable even if the nitrogen atom with an $sp^2$ hybrid orbital is reduced and also is stable even if the nitrogen atom with an $sp^3$ hybrid orbital is oxidized. Due to this, such an azaindolizine-based compound has high stability against electrons and holes. As a result, the life of the light-emitting element 1 can be extended.

The organic material (the first anthracene-based compound) contained in the first electron transport layer 6b may be any as long as the glass transition temperature Tg thereof is 135° C. or higher, but is preferably 145° C. or higher, more preferably 170° C. or higher. According to this, the deterioration of the first electron transport layer 6b can be more accurately suppressed or prevented from occurring, and therefore, the decrease in the light emission efficiency of the light-emitting element 1 caused thereby can be more accurately suppressed or prevented.

Second Electron Transport Layer

In this embodiment, the second electron transport layer 6a contains a second anthracene-based compound which has an anthracene skeleton but does not have a heterocyclic skeleton. In other words, the second electron transport layer 6a contains a second anthracene-based compound which has an anthracene skeleton in the molecule and is constituted by a carbon atom and a hydrogen atom. In such a second electron transport layer 6a, this second anthracene-based compound is contained as the organic material, and this second anthracene-based compound has a glass transition temperature Tg of 135° C. or higher or does not have a glass transition temperature.

The compound having an anthracene skeleton is a compound having an excellent electron transport property. Further, by using the second anthracene-based compound which does not have a heterocyclic skeleton, the second electron transport layer shows relatively strong resistance to oxidation and reduction due to transfer of holes, and therefore alteration or deterioration due to holes can be suppressed.

Here, the light-emitting material included in the light-emitting layer 5 is a material with a small band gap, and therefore, the difference in the HOMO and LUMO levels between the light-emitting material and the host material is increased. In particular, it is considered that when a thiadiazole-based compound having a skeleton with a strong electron-withdrawing property is used as the light-emitting material, an electron is easily trapped in the light-emitting material in the light-emitting layer because of the energy level, and the electron transfer is limited, and therefore, carriers which move in the light-emitting layer 5 are mostly holes. As a result, the number of holes penetrating from the light-emitting layer 5 to the electron transport layer 6 tends to increase.

Due to this, for example, when a compound having a nitrogen-containing heterocyclic skeleton is contained in the electron transport layer provided in contact with the light-emitting layer 5, since this compound has low durability against holes, deterioration is caused due to holes penetrating from the light-emitting layer 5, and as a result, a problem that the life of the light-emitting element is shortened occurs.

On the other hand, in this embodiment, the second electron transport layer 6a provided in contact with the light-emitting layer 5 contains a second anthracene-based compound which has an anthracene skeleton but does not have a heterocyclic skeleton, and therefore, the alteration or deterioration of the second electron transport layer 6a due to holes penetrating from the light-emitting layer 5 can be suppressed or prevented.

Then, this second electron transport layer 6a functions as a block layer that prevents holes from reaching the first electron transport layer 6b, and therefore, the alteration or deterioration of the first electron transport layer 6b containing the first anthracene-based compound having a nitrogen-containing heterocyclic skeleton due to holes can be suppressed or prevented.

The average thickness of the second electron transport layer 6a slightly varies depending on the type of the light-emitting material contained in the light-emitting layer 5, but is preferably 25 nm or more and 200 nm or less, more preferably 50 nm or more and 150 nm or less. According to this, the second electron transport layer 6a can be made to favorably exhibit a function as the block layer that prevents holes from reaching the first electron transport layer 6b.

Further, as the emission wavelength in a near-infrared range in the light-emitting element 1 is increased, the thickness of the stacked body 14 included in the light-emitting element 1 is required to be increased for optimizing the light extraction efficiency. Due to this, it is considered to be appropriate to increase the thickness of the second electron transport layer 6a that functions as a block layer from the viewpoint of the layer structure of the stacked body 14. Therefore, it is preferred to set the average thickness of the second electron transport layer 6a within the above range also from this point of view. Then, by using a material having a glass transition temperature Tg of 135° C. or higher as the organic material (second anthracene-based compound) contained in the second electron transport layer 6a whose occupancy ratio in the stacked body 14 is increased due to the above-mentioned reason, the deterioration of the light-emitting element 1 caused by fluidization of the second electron transport layer 6a can be accurately suppressed or prevented from occurring. Further, the second anthracene-based compound constituted by a carbon atom and a hydrogen atom is a compound which is relatively stable against heat, and therefore, also from this point of view, the deterioration of the light-emitting element 1 can be accurately suppressed or prevented from occurring.

Further, the second anthracene-based compound may be any as long as it is a compound which has a glass transition temperature Tg of 135° C. or higher or does not have a glass transition temperature among compounds represented by the following general formula ETL2, but is preferably a compound which has a glass transition temperature Tg of 135° C. or higher or does not have a glass transition temperature among compounds represented by the following formula ETL2-A or ETL2-B. According to this, the second anthracene-based compound can be relatively easily obtained as a compound which has a glass transition temperature Tg of 135° C. or higher or does not have a glass transition temperature.

More specifically, examples of the compound having a glass transition temperature Tg of 135° C. or higher among the compounds represented by the following formula ETL2-A include compounds represented by the following formulae ETL2-1 to ETL2-22. Further, examples of the compound having a glass transition temperature Tg of 135° C. or higher among the compounds represented by the following formula ETL2-B include compounds represented by the following formulae ETL2-23 to ETL2-31.

(General Formula)

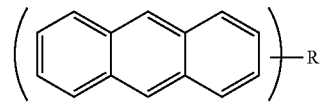

ETL2

In the above general formula ETL2, R represents a hydrogen atom, an alkyl group, an aryl group which may have a substituent, or an arylamino group.

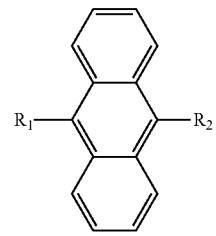

ETL2-A

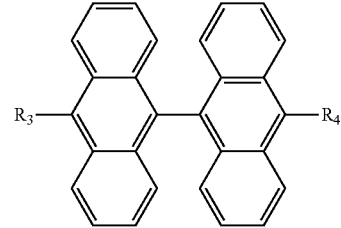

ETL2-B

In the above general formula ETL2-A, $R_1$ and $R_2$ each represent a hydrogen atom, an alkyl group, or an aryl group which may have a substituent, and $R_1$ and $R_2$ may be the same as or different from each other.

In the above general formula ETL2-B, $R_3$ and $R_4$ each represent a hydrogen atom, an alkyl group, or an aryl group which may have a substituent, and $R_3$ and $R_4$ may be the same as or different from each other.

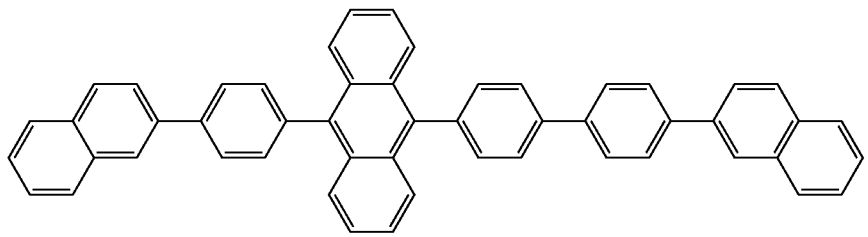
ELT2-1
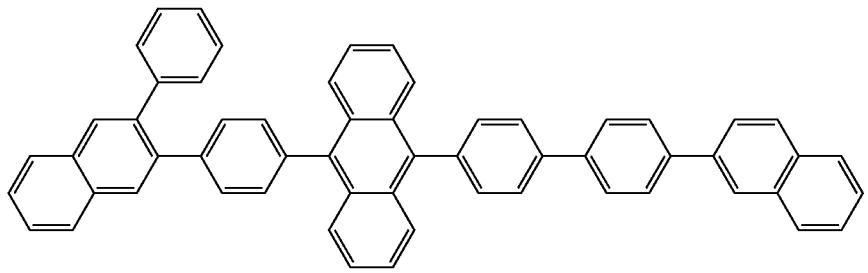
ELT2-2
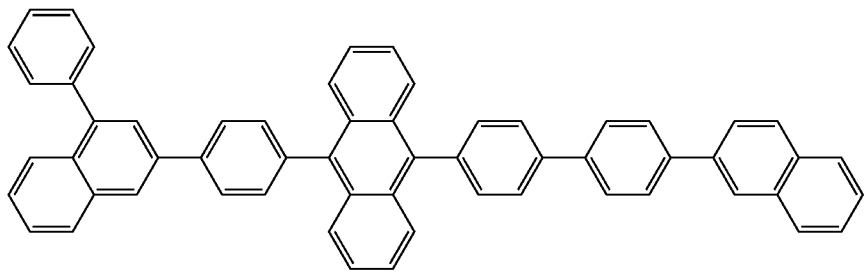
ELT2-3
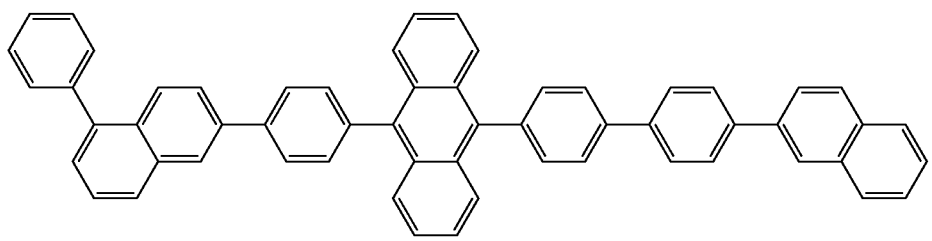
ELT2-4
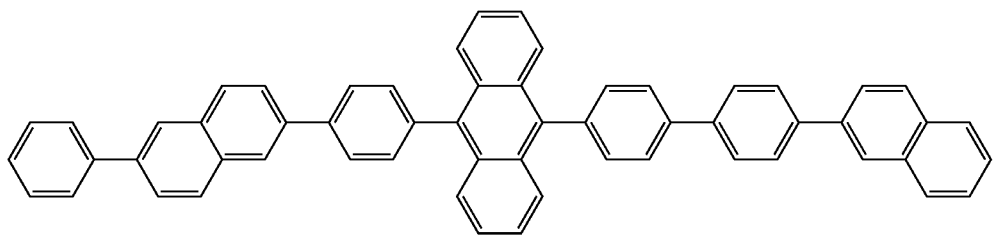
ELT2-5
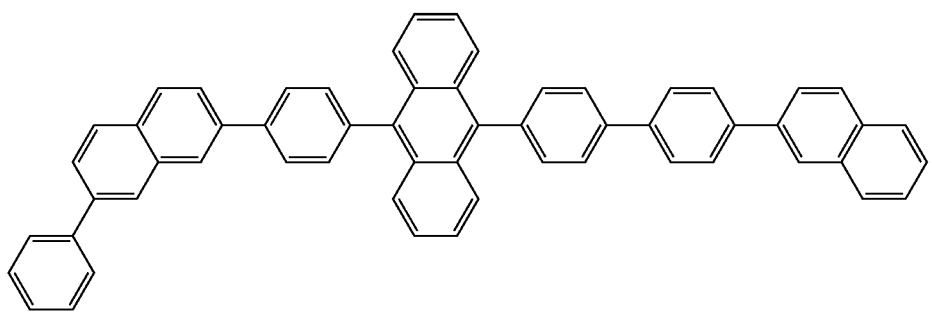
ETL2-6

-continued
ETL2-7
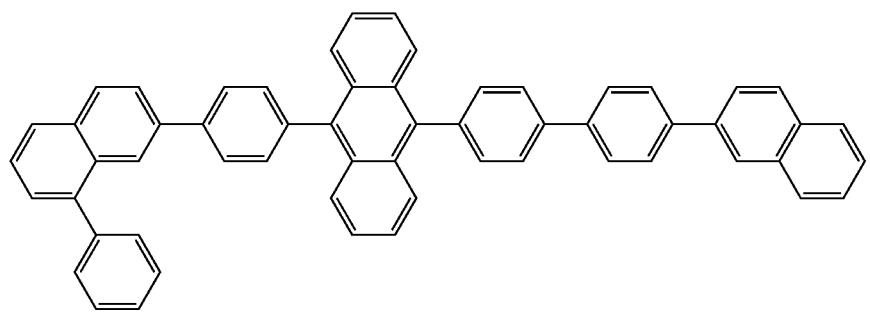
ETL2-8
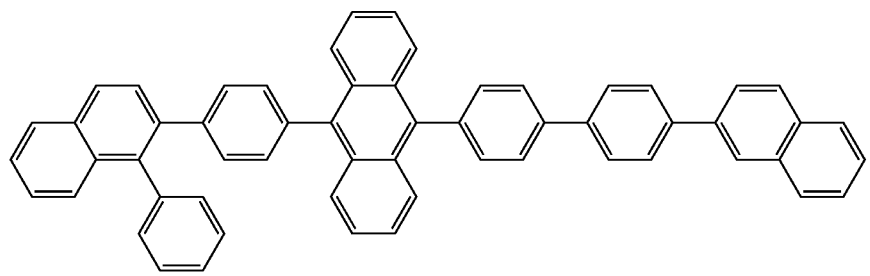
ETL2-9
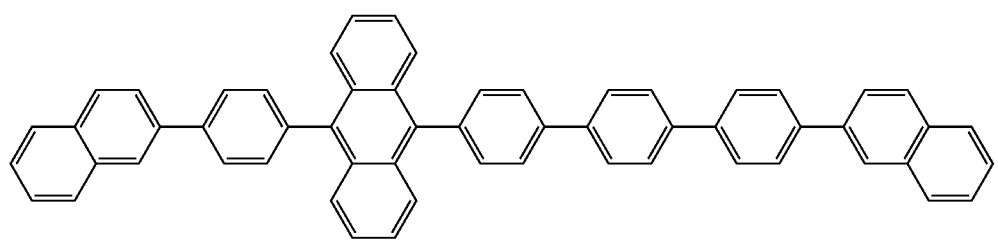
ETL2-10
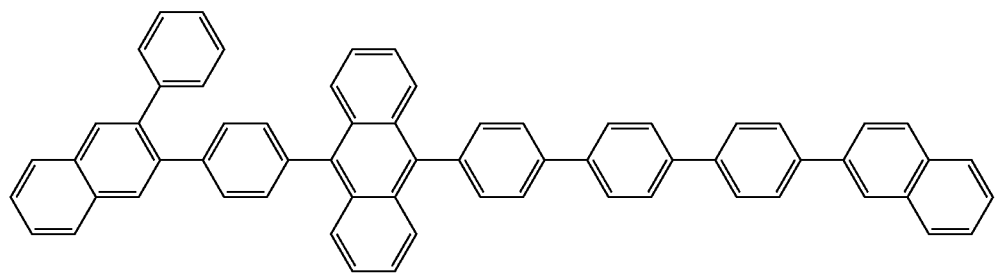
ETL2-11
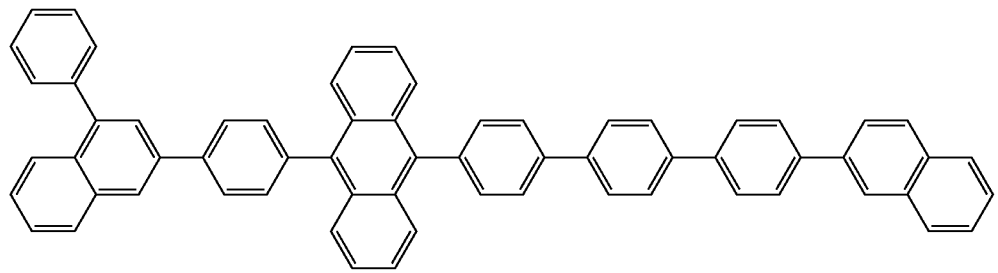
ETL2-12
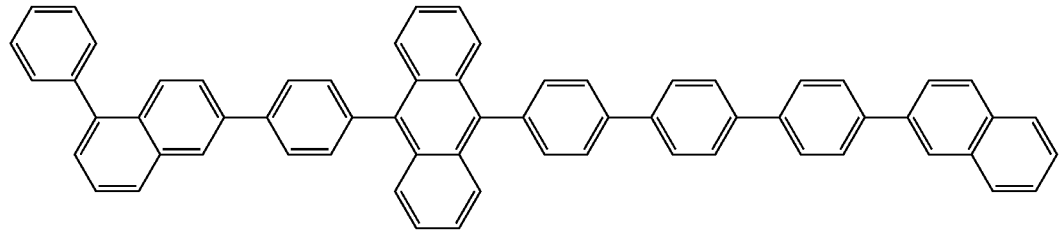

ETL2-13
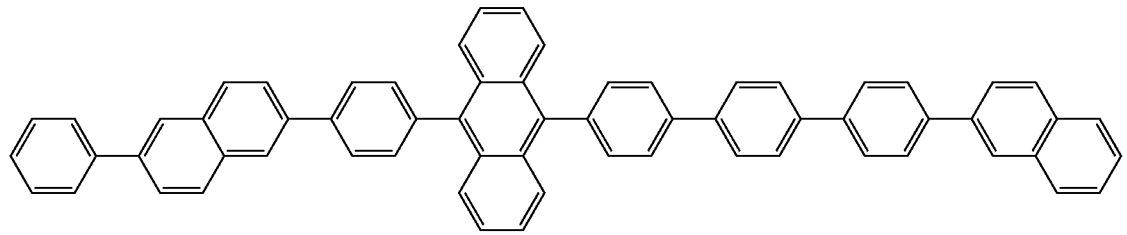
ETL2-14
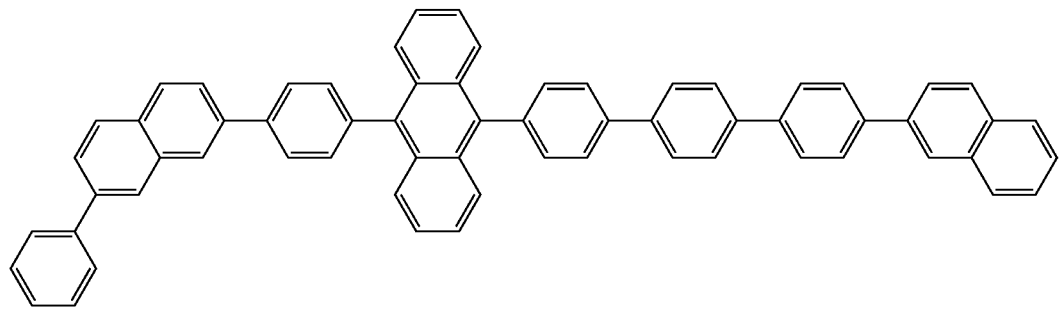
ETL2-15
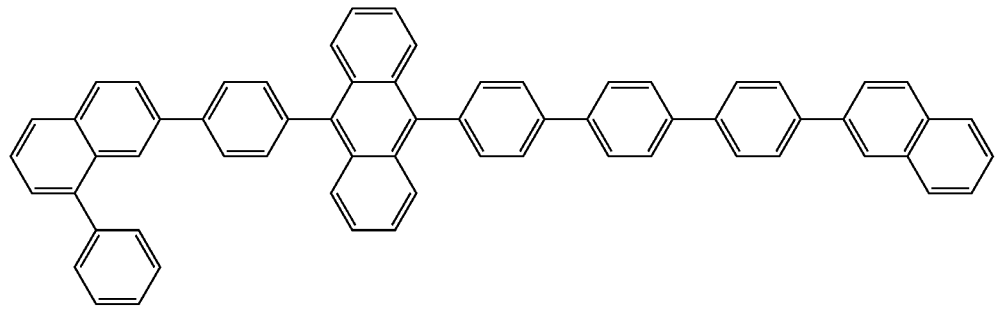
ETL2-16
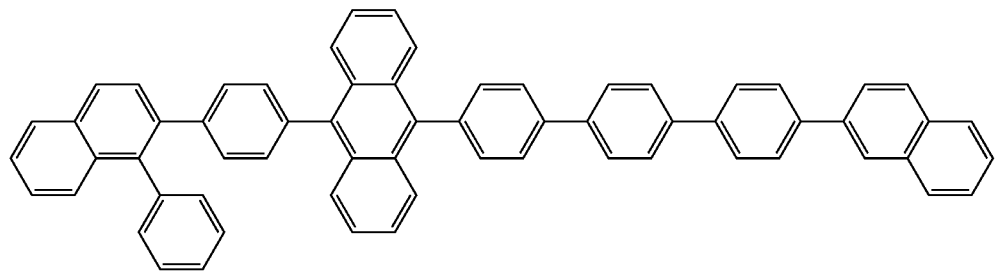
ETL2-17
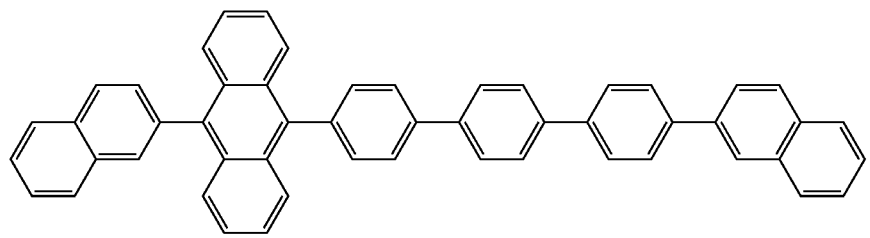

ETL2-18
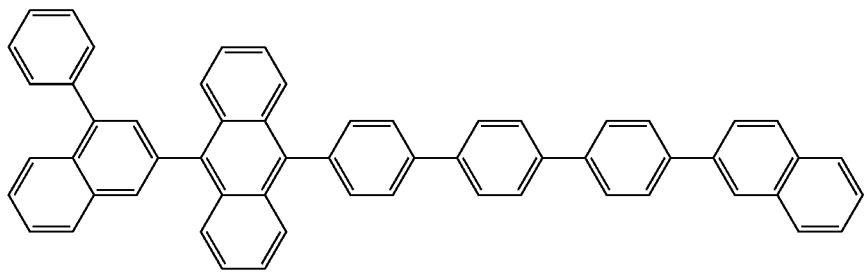
ETL2-19
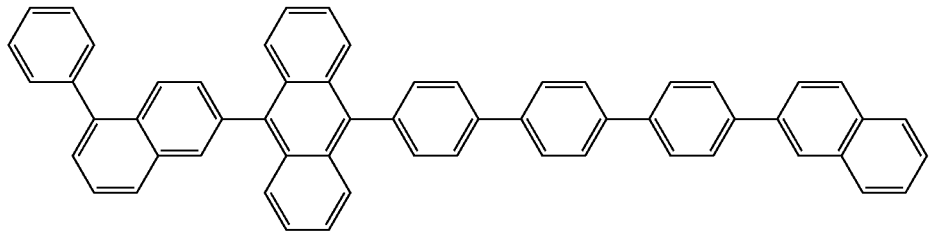
ETL2-20
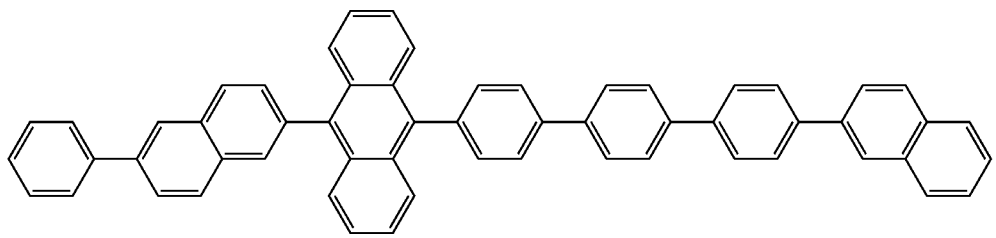
ETL2-21
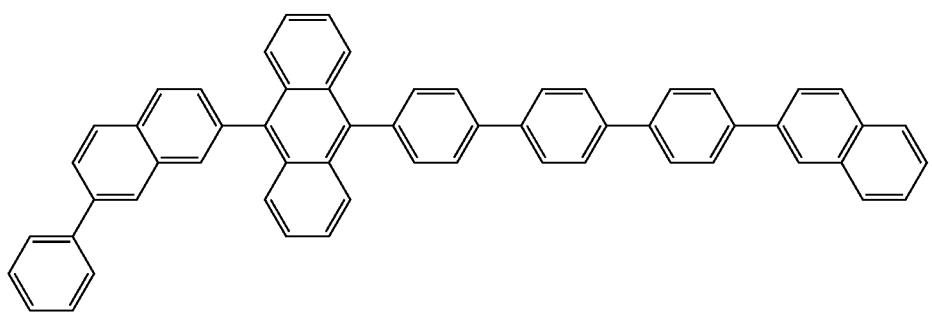
ETL2-22
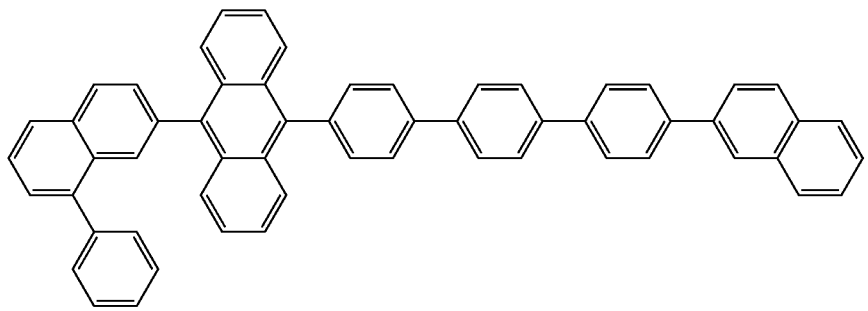
ETL2-23
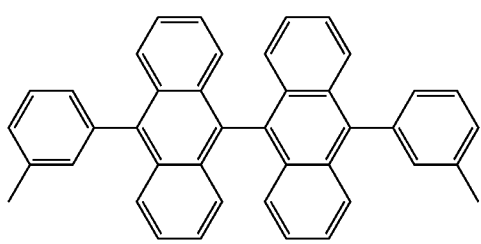
ETL2-24
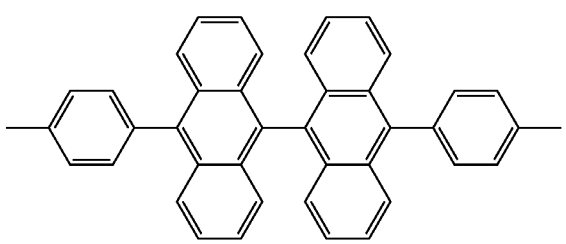

-continued

ETL2-25
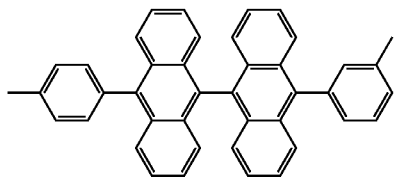

ETL2-26
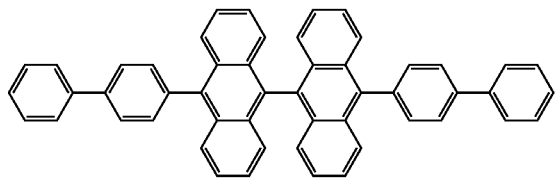

ETL2-27
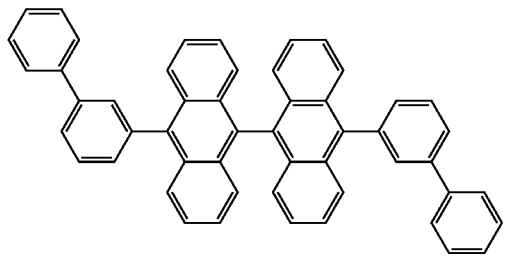

ETL2-28
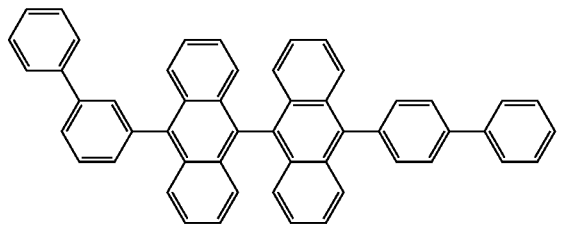

ETL2-29
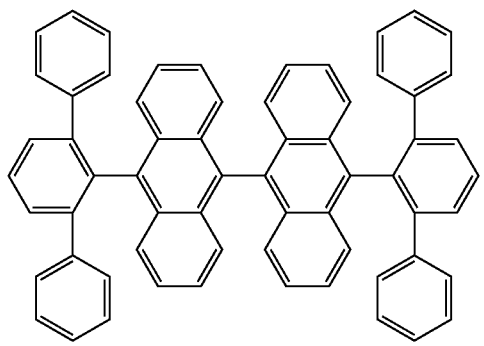

ETL2-30
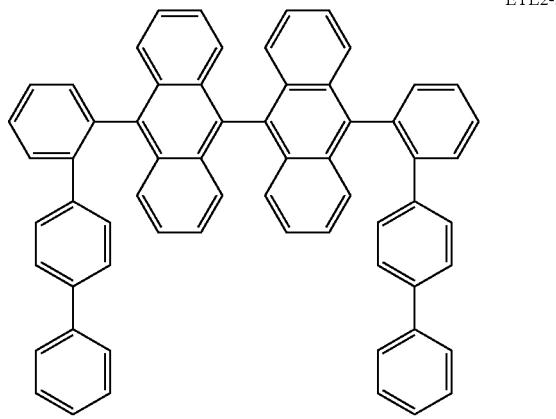

ETL2-31
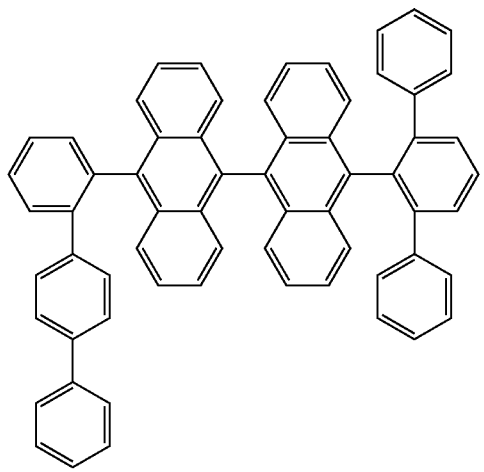

The organic material (the second anthracene-based compound) contained in the second electron transport layer 6a may be any as long as the glass transition temperature Tg thereof is 135° C. or higher, but is preferably 145° C. or higher, more preferably 170° C. or higher. According to this, the deterioration of the second electron transport layer 6a can be more accurately suppressed or prevented from occurring, and therefore, the decrease in the light emission efficiency of the light-emitting element 1 caused thereby can be more accurately suppressed or prevented.

Further, a difference between the HOMO of the organic material (the second anthracene-based compound) of the second electron transport layer 6a and the HOMO of the host material used in the light-emitting layer 5 is preferably 0.2 eV or more. According to this, holes can be prevented from passing through the light-emitting layer 5 to the electron transport layer 6, and thus, the light emission efficiency can be increased.

Further, a difference between the HOMO of the organic material (the second anthracene-based second electron transport layer 6a and the HOMO of the organic material (the first anthracene-based compound) of the first electron transport layer 6b is preferably 0.2 eV or more, and also a difference between the LUMO of the organic material (the second anthracene-based compound) of the second electron transport layer 6a and the LUMO of the organic material (the first anthracene-based compound) of the first electron transport layer 6b is preferably 0.2 eV or more. According to this, while preventing holes from passing through the second electron transport layer 6a to the first electron transport layer 6b, electrons can be smoothly transported from the first electron transport layer 6b to the second electron transport layer 6a, and therefore, the efficiency of the light-emitting element 1 is increased.

Also, it is preferred that the electron mobility of the organic material (the second anthracene-based compound) of the second electron transport layer 6a is larger than the electron mobility of the organic material (the first anthracene-based compound) of the first electron transport layer 6b. According to this, electrons can be smoothly transported from the first electron transport layer 6b to the second electron transport layer 6a.

The HOMO of the organic material (the second anthracene-based compound) of the second electron transport layer 6a is preferably 5.5 eV or more and 6.0 eV or less, and the LUMO of the organic material of the second electron transport layer 6a is preferably 2.5 eV or more and 3.0 eV or less.

Further, the HOMO of the organic material (the first anthracene-based compound) of the first electron transport layer 6b is preferably 5.8 eV or more and 6.5 eV or less, and the LUMO of the organic material of the first electron transport layer 6b is preferably 2.8 eV or more and 3.5 eV or less.

The first anthracene-based compound and the second anthracene-based compound each have a glass transition temperature Tg of 135° C. or higher. According to this, even if the light-emitting element 1 is used by conducting electricity between the anode 3 and the cathode 8 at a current density of about 0.5 A/cm² or more and 2.0 A/cm² or less, the electron transport layer 6 (the first electron transport layer 6b and the second electron transport layer 6a) can be suppressed or prevented from being fluidized, and therefore, the decrease in the light emission efficiency of the light-emitting element 1 caused thereby can be suppressed or prevented.

In this embodiment, a case where the second anthracene-based compound contained in the second electron transport layer 6a has an anthracene skeleton but does not have a heterocyclic skeleton has been described, however, for example, in the case where the light-emitting element 1 has a configuration in which penetration of holes from the light-emitting layer 5 is suppressed, a compound having an anthracene skeleton and a nitrogen-containing heterocyclic skeleton described as the first anthracene-based compound can also be used as the second anthracene-based compound.

Electron Injection Layer

The electron injection layer 7 has a function to improve the efficiency of electron injection from the cathode 8.

Examples of the constituent material (electron-injecting material) of the electron injection layer 7 include various types of inorganic insulating materials and various types of inorganic semiconductor materials.

Examples of such an inorganic insulating material include alkali metal chalcogenides (oxides, sulfides, selenides, and tellurides), alkaline earth metal chalcogenides, alkali metal halides, and alkaline earth metal halides. Among these, one type or two or more types in combination can be used. By constituting the electron injection layer 7 by such a material as a main material, the electron injection property can be further improved. In particular, an alkali metal compound (such as an alkali metal chalcogenide or an alkali metal halide) has a very low work function, and by constituting the electron injection layer 7 by using the compound, the light-emitting element 1 has high luminance.

Examples of the alkali metal chalcogenide include $Li_2O$, LiO, $Na_2S$, $Na_2Se$, and NaO.

Examples of the alkaline earth metal chalcogenide include CaO, BaO, SrO, BeO, BaS, MgO, and CaSe.

Examples of the alkali metal halide include CsF, LiF, NaF, KF, LiCl, KCl, and NaCl.

Examples of the alkaline earth metal halide include $CaF_2$, $BaF_2$, $SrF_2$, $MgF_2$, and $BeF_2$.

Examples of the inorganic semiconductor material include oxides, nitrides, and oxynitrides containing at least one element selected from Li, Na, Ba, Ca, Sr, Yb, Al, Ga, In, Cd, Mg, Si, Ta, Sb, and Zn. Among these, one type or two or more types in combination can be used.

The average thickness of the electron injection layer 7 is not particularly limited, but is preferably from about 0.1 to 1000 nm, more preferably from about 0.2 to 100 nm, further more preferably from about 0.2 to 50 nm.

The electron injection layer 7 may be omitted depending on the constituent material, thickness, or the like of the cathode 8 and the electron transport layer 6.

Sealing Member

The sealing member 9 is provided so as to cover the anode 3, the stacked body 14, and the cathode 8, and has a function to hermetically seal these members and block oxygen and moisture. By providing the sealing member 9, an effect of improvement of the reliability of the light-emitting element 1, prevention of the alteration or deterioration (improvement of the durability) of the light-emitting element 1, or the like is obtained.

Examples of the constituent material of the sealing member 9 include Al, Au, Cr, Nb, Ta, Ti, an alloy containing any of these materials, silicon oxide, and various types of resin materials. In the case where a material having electrical conductivity is used as the constituent material of the sealing member 9, in order to prevent a short circuit, it is preferred to provide an insulating film as needed between the sealing member 9 and each of the anode 3, the stacked body 14, and the cathode 8.

Further, the sealing member 9 may be formed into a flat plate shape and made to face the substrate 2, and a space therebetween may be sealed with, for example, a sealant such as a thermosetting resin.

According to the light-emitting element 1 configured as described above, the organic materials contained in the hole injection layer 4, the light-emitting layer 5, the second electron transport layer 6a, and the first electron transport layer 6b have a glass transition temperature Tg of 135° C. or higher or do not have a glass transition temperature, and therefore, even in the case where the light-emitting element 1 is driven at a large current, the light-emitting element 1 can emit light in a near-infrared range, and also the efficiency and life thereof can be increased.

Incidentally, the organic materials contained in the hole injection layer 4, the light-emitting layer 5, the second electron transport layer 6a, and the first electron transport layer 6b may be any as long as they have a glass transition temperature Tg of 135° C. or higher or do not have a glass transition temperature, however, it is preferred that when the glass transition temperatures Tg of the host material contained in the light-emitting layer 5, the hole-injecting material contained in the hole injection layer 4, and the second anthracene-based compound contained in the second electron transport layer 6a are represented by Tg(Host), Tg(HIL), and Tg(ETL2), respectively, Tg(Host), Tg(HIL), and Tg(ETL2) satisfy the following relational formula (I). According to this, even if the temperature of the stacked body 14 exceeds Tg(Host) by heating the stacked body 14 and the light-emitting layer 5 preferentially shows fluidity, since the hole injection layer 4 and the second electron transport layer 6a adjacent to the light-emitting layer 5 are accurately suppressed or prevented from showing fluidity, the diffusion of the organic material (particularly, the light-emitting material) contained in the light-emitting layer 5 can be prevented.

$$Tg(HIL)>Tg(Host) \text{ and } Tg(ETL2)>Tg(Host) \tag{I}$$

Further, it is preferred that Tg(HIL) and Tg(ETL2) satisfy the following relational formula (II). According to this, when the temperature of the stacked body 14 exceeds Tg(Host) by heating the stacked body 14 and the light-emitting layer 5 shows fluidity, among the hole injection layer 4 and the second electron transport layer 6a adjacent to the light-emitting layer 5, the fluidity of the second electron transport layer 6a is higher than the fluidity of the hole injection layer 4. Here, in the case where the hole-injecting material contained in the hole injection layer 4 and the second anthracene-based compound contained in the second electron transport layer 6a are configured as described above, the chemical interaction with the light-emitting material contained in the light-emitting layer 5 is lower in the case of the second anthracene-based compound. Due to this, even if the fluidity of the second electron transport layer 6a is increased and the light-emitting material diffuses and transfers into the second electron transport layer 6a, the change in the light emission characteristics of the light-emitting element 1 due to the alteration or deterioration of the second electron transport layer 6a caused by chemical interaction between the light-emitting material and the second anthracene-based compound can be minimized.

$$Tg(HIL)>Tg(ETL2) \tag{II}$$

The light-emitting element 1 as described above can be produced, for example, as described below.

(1) First, a substrate 2 is prepared and an anode 3 is formed on the substrate 2.

The anode 3 can be formed by using, for example, a dry plating method such as a chemical vapor deposition (CVD) method such as plasma CVD or thermal CVD, or vacuum deposition, a wet plating method such as electroplating, a thermal spraying method, a sol-gel method, a metal organic deposition (MOD) method, metal foil joining, or the like.

(2) Subsequently, a hole injection layer 4 is formed on the anode 3.

The hole injection layer 4 is preferably formed by, for example, a gas phase process using a dry plating method such as a CVD method, vacuum deposition, or sputtering, or the like.

The hole injection layer 4 can also be formed by, for example, dissolving a hole-injecting material in a solvent or dispersing a hole-injecting material in a dispersion medium to prepare a hole injection layer-forming material and supplying the hole injection layer-forming material onto the anode 3, followed by drying (removal of the solvent or the dispersion medium).

As the method for supplying the hole injection layer-forming material, for example, any of various coating methods such as a spin coating method, a roll coating method, and an ink jet printing method can be used. The hole injection layer 4 can be relatively easily formed by using such a coating method.

Examples of the solvent or the dispersion medium used in the preparation of the hole injection layer-forming material include various types of inorganic solvents, various types of organic solvents, and mixed solvents containing any of these solvents.

The drying can be performed, for example, by leaving the material to stand in an atmosphere at atmospheric pressure or reduced pressure, by a heating treatment, by spraying an inert gas, or the like.

Further, prior to this step, the upper face of the anode 3 may be subjected to an oxygen plasma treatment. By doing this, lyophilicity can be imparted to the upper face of the anode 3, an organic substance adhered to the upper face of the anode 3 can be removed (washed off), the work function in the vicinity of the upper face of the anode 3 can be adjusted, and so on.

The conditions for the oxygen plasma treatment are preferably, for example, as follows: the plasma power is about from 100 to 800 W, the oxygen gas flow rate is about from 50 to 100 mL/min, the speed of conveying a member to be treated (anode 3) is about from 0.5 to 10 mm/sec, and the temperature of the substrate 2 is about from 70 to 90° C.

(3) Subsequently, a light-emitting layer 5 is formed on the hole injection layer 4.

The light-emitting layer 5 can be formed by, for example, a gas phase process using a dry plating method such as vacuum deposition, or the like.

(4) Subsequently, an electron transport layer 6 (a first electron transport layer 6b and a second electron transport layer 6a) is formed on the light-emitting layer 5.

It is preferred that the electron transport layer 6 (the first electron transport layer 6b and the second electron transport layer 6a) is formed by, for example, a gas phase process using a dry plating method such as vacuum deposition, or the like.

The electron transport layer 6 can also be formed by, for example, dissolving an electron-transporting material in a solvent or dispersing an electron-transporting material in a dispersion medium to prepare an electron transport layer-forming material and supplying the electron transport layer-forming material onto the light-emitting layer 5, followed by drying (removal of the solvent or the dispersion medium).

(5) Subsequently, an electron injection layer 7 is formed on the electron transport layer 6.

In the case where an inorganic material is used as the constituent material of the electron injection layer 7, the electron injection layer 7 can be formed by using, for example, a gas phase process using a dry plating method such as a CVD method, vacuum deposition, or sputtering, or the like, coating and firing of an inorganic fine particle ink, or the like.

(6) Subsequently, a cathode 8 is formed on the electron injection layer 7.

The cathode 8 can be formed by using, for example, a vacuum deposition method, a sputtering method, metal foil joining, coating and firing of a metal fine particle ink, or the like.

The light-emitting element 1 is obtained through the steps as described above.

Finally, a sealing member 9 is placed so as to cover the obtained light-emitting element 1 and joined to the substrate 2.

Light-Emitting Device

Next, an embodiment of the light-emitting device according to the invention will be described.

Figure 2:
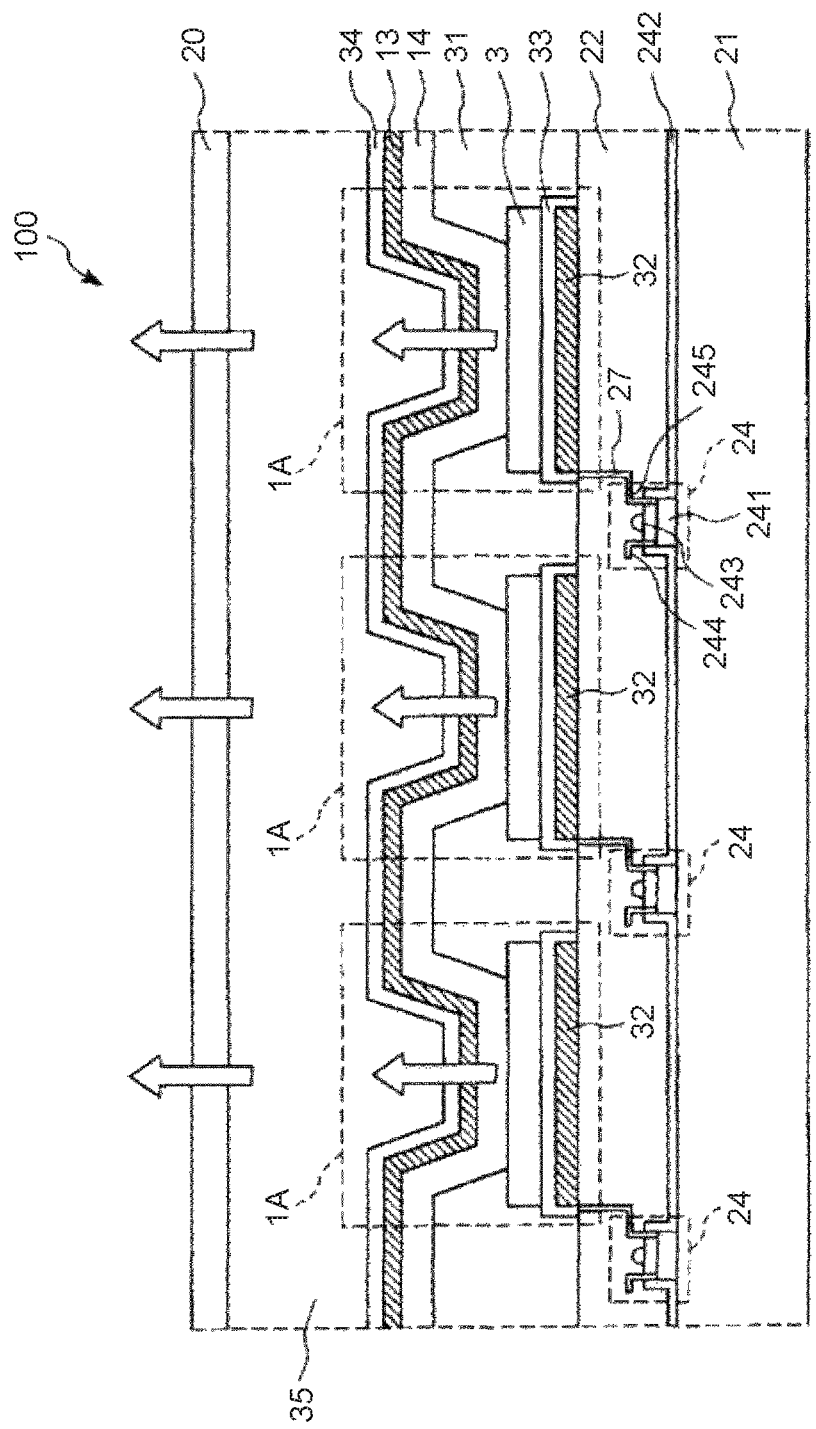
FIG. 2 is a longitudinal cross-sectional view showing an embodiment of a display device to which a light-emitting device according to the invention is applied.

FIG. 2 is a longitudinal cross-sectional view showing an embodiment of a display device to which the light-emitting device according to the invention is applied.

A display device 100 shown in FIG. 2 includes a substrate 21, a plurality of light-emitting elements 1A, and a plurality of driving transistors 24 for driving the respective light-emitting elements 1A. Here, the display device 100 is a display panel having a top emission structure.

On the substrate 21, the plurality of driving transistors 24 are provided, and a planarization layer 22 constituted by an insulating material is formed so as to cover these driving transistors 24.

Each driving transistor 24 includes a semiconductor layer 241 composed of silicon, a gate insulating layer 242 formed on the semiconductor layer 241, a gate electrode 243 formed on the gate insulating layer 242, a source electrode 244, and a drain electrode 245.

On the planarization layer 22, the light-emitting elements 1A are provided corresponding to the respective driving transistors 24.

In the light-emitting element 1A, on the planarization layer 22, a reflective film 32, an anticorrosive film 33, an anode 3, a stacked body (an organic EL light-emitting section) 14, a cathode 13, and a cathode cover 34 are stacked in this order. In this embodiment, the anode 3 of each light-emitting element 1A constitutes a pixel electrode and is electrically connected to the drain electrode 245 of each driving transistor 24 through an electrical conductive section (wire) 27. Further, the cathode 13 of each light-emitting element 1A acts as a common electrode.

The light-emitting element 1A in FIG. 2 emits light in a near-infrared range, and the light-emitting element 1 according to the invention described above is applied.

Between the adjacent light-emitting elements 1A, a partition 31 is provided. Further, on the light-emitting elements 1A, an epoxy layer 35 constituted by an epoxy resin is formed so as to cover the light-emitting elements 1A.

Further, on the epoxy layer 35, a sealing substrate 20 is provided so as to cover the epoxy layer 35.

The display device 100 as described above can be used as, for example, a near-infrared display for military use or the like.

According to such a display device 100, light in a near-infrared range can be emitted. Further, since the display device 100 includes the light-emitting element 1A with high efficiency and long life, and therefore has excellent reliability.

Authentication Device

Next, an embodiment of the authentication device according to the invention will be described.

Figure 3:
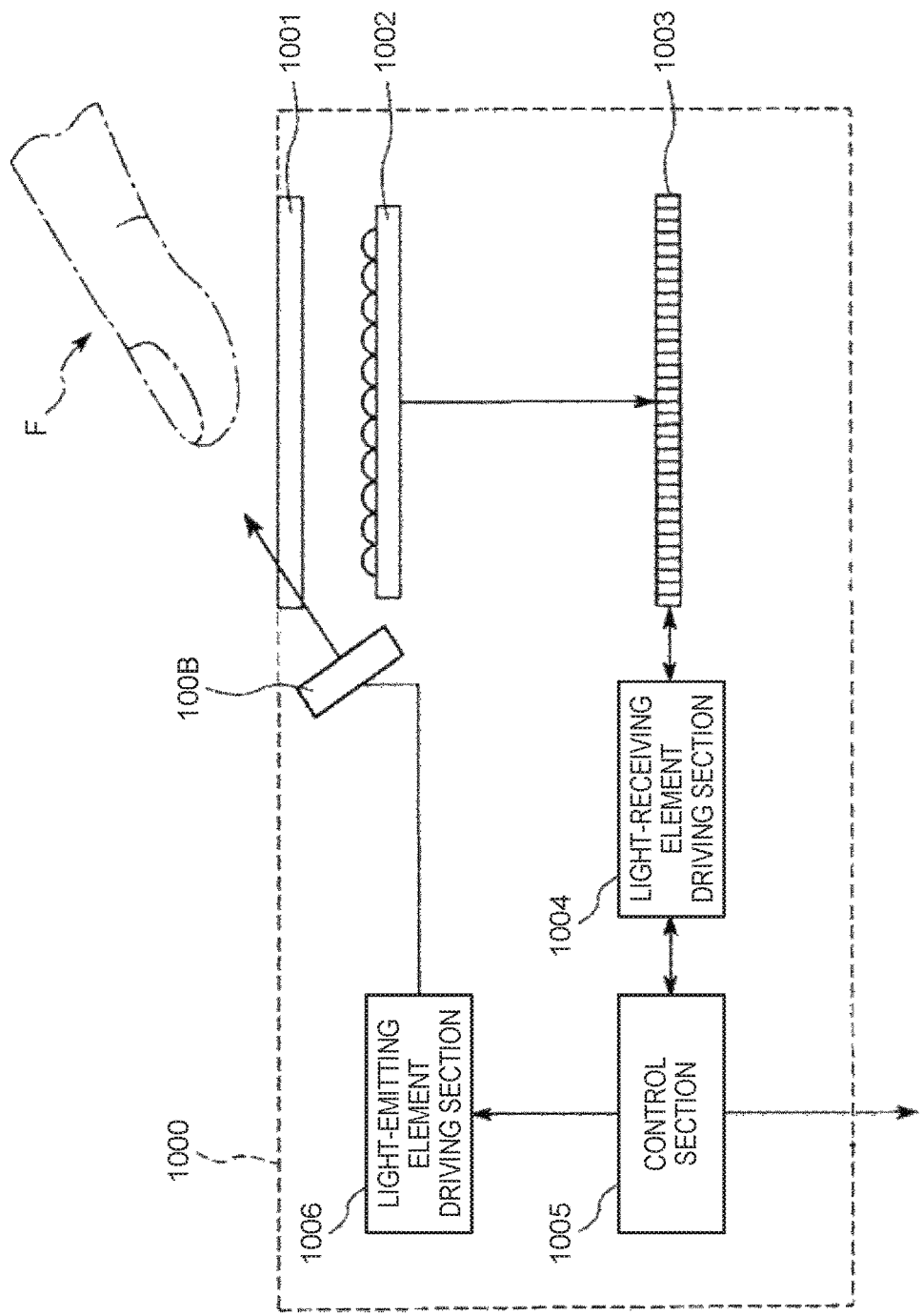
FIG. 3 is a view showing an embodiment of an authentication device according to the invention.

FIG. 3 is a view showing an embodiment of the authentication device according to the invention.

An authentication device 1000 shown in FIG. 3 is a biometric authentication device which authenticates an individual using the biological information of a living body F (in this embodiment, a fingertip).

The authentication device 1000 includes a light source 100B, a cover glass 1001, a microlens array 1002, a light-receiving element group 1003, a light-emitting element driving section 1006, a light-receiving element driving section 1004, and a control section 1005.

The light source 100B includes a plurality of light-emitting elements 1 described above, and irradiates light in a near-infrared range onto the living body F which is the objet to be imaged. For example, the light-emitting elements 1 of the light source 1008 are arranged along the outer circumference of the cover glass 1001.

The light-emitting element used in the light source 100B is generally used by conducting electricity at a current density of about 0.5 A/cm$^2$ or more and 2.0 A/cm$^2$ or less, and the light-emitting element 1 according to the invention with increased efficiency and extended life is favorably used as such a light-emitting element.

The cover glass 1001 is apart which the living body F comes into contact with or comes close to.

The microlens array 1002 is provided on the side opposite to the side of the cover glass 1001 which the living body F comes into contact with or comes close to. This microlens array 1002 is constituted by a plurality of microlenses arranged in a matrix.

The light-receiving element group 1003 is provided on the side opposite to the cover glass 1001 with respect to the microlens array 1002. The light-receiving element group 1003 is constituted by a plurality of light-receiving elements provided in a matrix corresponding to the plurality of microlenses of the microlens array 1002. As each light-receiving element of the light-receiving element group 1003, for example, a CCD (Charge Coupled Device), a CMOS, or the like can be used.

The light-emitting element driving section 1006 is a driving circuit that drives the light source 100B.

The light-receiving element driving section 1004 is a driving circuit that drives the light-receiving element group 1003.

The control section 1005 is, for example, an MPU, and has a function to control the driving of the light-emitting element driving section 1006 and the light-receiving element driving section 1004.

Further, the control section 1005 has a function to perform authentication of the living body F by comparison between the light reception result of the light-receiving element group 1003 and the previously stored biometric authentication information.

For example, the control section 1005 forms an image pattern (for example, a vein pattern) associated with the living body F based on the light reception result of the light-receiving element group 1003. Then, the control section 1005 compares the formed image pattern and the image pattern previously stored as the biometric authentication information, and performs authentication (for example, vein authentication) of the living body F based on the comparison result.

According to such an authentication device 1000, biometric authentication can be performed using near-infrared light. Further, the authentication device 1000 includes the light-emitting element 1 with high efficiency and long life, and therefore has excellent reliability.

Such an authentication device 1000 can be incorporated into various types of electronic apparatuses.

Electronic Apparatus

Figure 4:
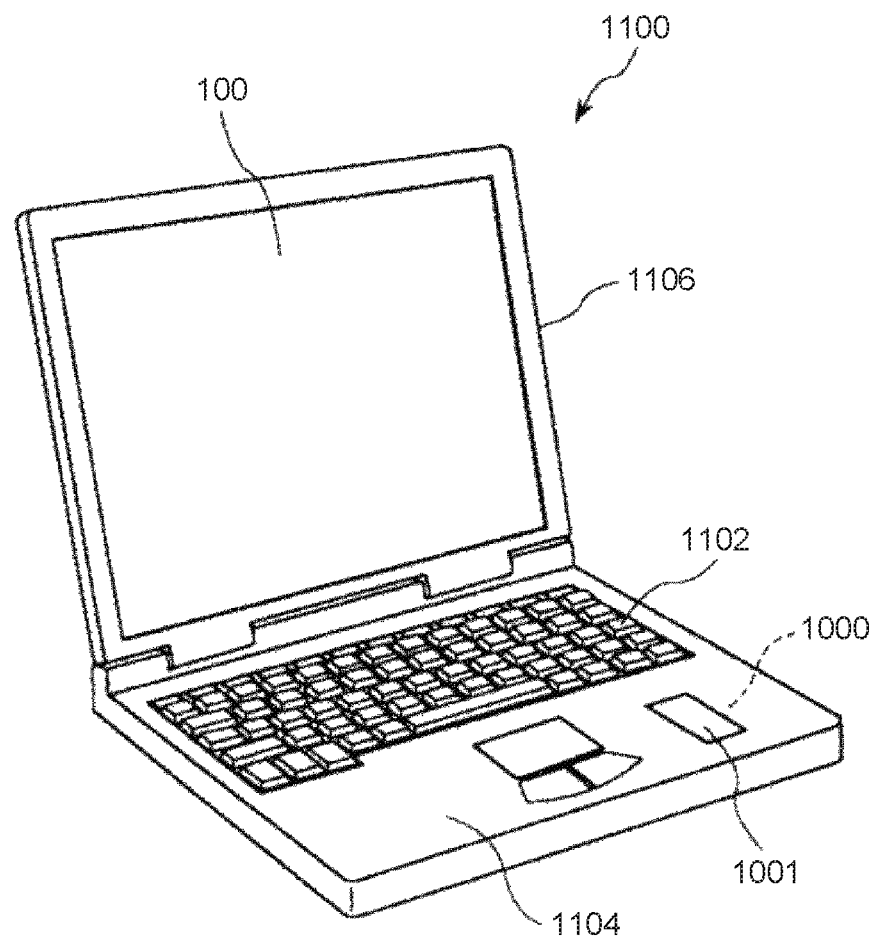
FIG. 4 is a perspective view showing the configuration of a mobile-type (or notebook-type) personal computer to which an electronic apparatus according to the invention is applied.

FIG. 4 is a perspective view showing the configuration of a mobile-type (or notebook-type) personal computer to which an electronic apparatus according to the invention is applied.

In this drawing, a personal computer 1100 is configured to include a main body 1104 provided with a keyboard 1102 and a display unit 1106 provided with a display section, and the display unit 1106 is supported rotatably with respect to the main body 1104 through a hinge structure.

In the personal computer 1100, the main body 1104 is provided with the above-mentioned authentication device 1000.

The personal computer 1100 includes the light-emitting element 1 with high efficiency and long life, and therefore has excellent reliability.

The electronic apparatus according to the invention can be applied not only to the personal computer (mobile-type personal computer) shown in FIG. 4, but also, for example, to a smartphone, a tablet terminal, a timepiece, a mobile phone, a digital still camera, a television, a video camera, a view finder-type or monitor direct view-type video tape recorder, a laptop-type personal computer, a car navigation device, a pager, an electronic organizer (including an electronic organizer with a communication function), an electronic dictionary, an electronic calculator, an electronic gaming machine, a word processor, a workstation, a videophone, a security television monitor, electronic binoculars, a POS terminal, an apparatus provided with a touch panel (for example, a cash dispenser in financial institutions and an automatic ticket vending machine), a medical apparatus (for example, an electronic thermometer, a sphygmomanometer, a blood glucose meter, a sphygmometer, a plethysmograph, an electrocardiographic apparatus, an ultrasonic diagnostic apparatus, or a display device for an endoscope), a fish finder, various types of measurement apparatuses, meters and gauges (for example, meters and gauges for vehicles, aircrafts, and ships), a flight simulator, other various types of monitors, a projection-type display device such as a projector, and the like.

Hereinabove, the light-emitting element, the light-emitting device, the authentication device, and the electronic apparatus according to the invention have been described with reference to the embodiments shown in the drawings, however, the invention is not limited thereto.

For example, the light-emitting element and the light-emitting device according to the invention may be used as a light source for lighting.

EXAMPLES

Next, specific examples of the invention will be described.

1. Production of Light-Emitting Material

Production of IRD1-2

Synthesis (A1-1)

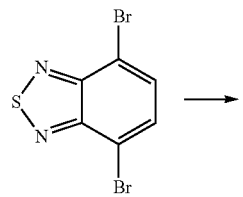

-continued

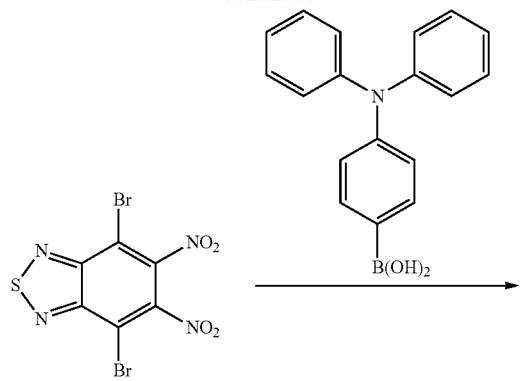

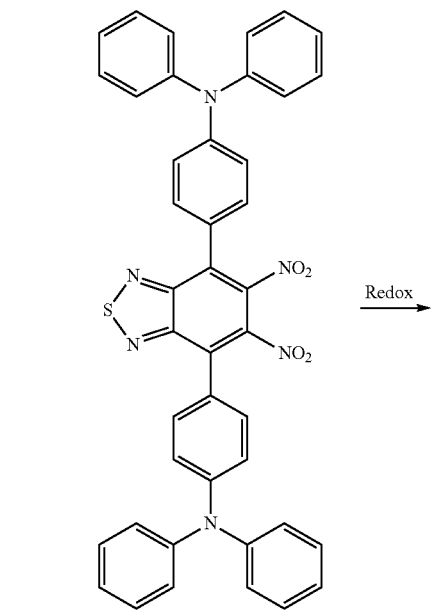

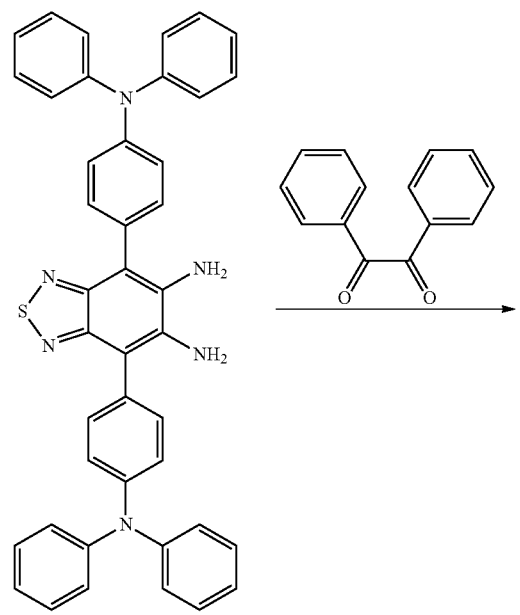

-continued

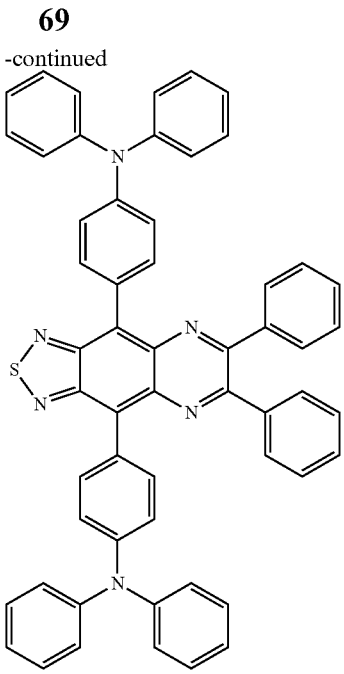

Synthesis (A1-1)

In a 5-L flask, 1500 mL of fuming nitric acid was placed and then cooled. Thereto, 1500 mL of sulfuric acid was added in divided portions such that the temperature was maintained at 10 to 50° C. Further, 150 g of a compound (a) which is dibromobenzothiadiazole as a starting material was added thereto in small portions over 1 hour. At this time, the temperature of the solution was maintained at 5° C. or lower. After completion of the addition of the total amount, a reaction was allowed to proceed for 20 hours at room temperature (25° C.). After the reaction, the reaction mixture was poured in 3 kg of ice, followed by stirring overnight. Thereafter, the mixture was filtered, followed by washing with methanol and heptane.

The residue after filtration was thermally dissolved in 200 mL of toluene, and the resulting solution was gradually cooled to room temperature and then filtered. The resulting residue was washed with a small amount of toluene, and then dried under reduced pressure.

By doing this, 60 g of a compound (b) (4,7-dibromo-5,6-dinitro-benzo[1,2,5]thiadiazole) with an HPLC purity of 95% was obtained.

Synthesis (A1-2)

In an Ar atmosphere, in a 5-L flask, 30 g of the compound (b) which is the obtained dibromo compound, 160 g of a triphenylamine boronic acid substance, 2500 mL of toluene, and a 2 M aqueous solution of cesium carbonate (152 g/234 mL of distilled water) were placed, and a reaction was allowed to proceed overnight at 90° C. After the reaction, filtration, liquid separation, and concentration were performed, and 52 g of the resulting crude material was separated using a silica gel column (5 kg of $SiO_2$), whereby a red-purple solid was obtained.

By doing this, 6 g of a compound (c) (5,6-dinitro-4,7-diphenyl-benzo[1,2,5]thiadiazole) with an HPLC purity of 96% was obtained.

Synthesis (A1-3)

In an Ar atmosphere, in a 1-L flask, 6 g of the compound (c) which is the obtained dinitro compound, 7 g of reduced iron, and 600 mL of acetic acid were placed, and a reaction was allowed to proceed at 80° C. for 4 hours, and then the temperature was cooled to room temperature. After the reaction, the reaction mixture was poured in 1.5 L of ion exchanged water, and then, 1.5 L of ethyl acetate was further added thereto. After the addition, a solid was deposited, and therefore, 1 L of tetrahydrofuran and 300 g of sodium chloride were added thereto, and liquid separation was performed. The aqueous layer was reextracted with 1 L of tetrahydrofuran, followed by concentration and drying. The resulting residue was again washed with a small amount of water and methanol, whereby an orange solid was obtained.

By doing this, 7 g of a compound (d) (4,7-diphenyl-benzo[1,2,5]thiadiazole-5,6-diamine) with an HPLC purity of 80% was obtained.

Synthesis (A1-4)

In an Ar atmosphere, in a 1-L flask, 4.5 g of the compound (d) which is the obtained diamine compound, 3.7 g of benzil, and 300 mL of acetic acid as a solvent were placed, and a reaction was allowed to proceed at 80° C. for 2 hours. After the reaction, the reaction mixture was cooled to room temperature, and then poured in 1 L of ion exchanged water. The resulting crystal was filtered and washed with water, whereby 7 g of a black-green solid was obtained. Then, this black green solid was purified using a silica gel column (1 kg of $SiO_2$).

By doing this, 4 g of a compound (e) (a compound represented by the above formula IRD1-2) with an HPLC purity of 99% was obtained. This compound (e) was subjected to mass analysis, and the result was as follows: M+: 492.

Further, the obtained compound (e) was purified by sublimation at a set temperature of 340° C. The HPLC purity of the compound (e) after the purification by sublimation was 99%.

2. Production of Light-Emitting Element

Example 1

(1) First, a transparent glass substrate having an average thickness of 0.5 mm was prepared. Subsequently, on this substrate, an ITO electrode (anode) having an average thickness of 100 nm was formed by a sputtering method.

Then, the substrate was subjected to ultrasonic cleaning while immersing the substrate in acetone and then in 2-propanol, and thereafter subjected to an oxygen plasma treatment and an argon plasma treatment. These plasma treatments were performed while heating the substrate to 70 to 90° C. under the conditions that the plasma power was 100 W, the gas flow rate was 20 sccm, and the treatment time was 5 sec, respectively.

(2) Subsequently, a compound (a hole-injecting material) represented by the above formula HIL-1 was deposited on the ITO electrode by a vacuum deposition method, whereby a hole injection layer having an average thickness of 50 nm was formed.

Incidentally, the Tg of the compound represented by the above formula HIL-1 was 137° C.

(3) Subsequently, the constituent material of a light-emitting layer was deposited on the hole injection layer by a vacuum deposition method, whereby the light-emitting layer having an average thickness of 25 nm was formed. As the constituent material of the light-emitting layer, a compound (a thiadiazole-based compound) represented by the above formula IRD1-2 serving as a light-emitting material (guest material) was used, and a compound (a tetracene-based compound) represented by the above formula H-1 was used as a host material. Further, the content (doping concentration) of the light-emitting material (dopant) in the light-emitting layer was set to 2.0 wt %.

Incidentally, the Tg of the compound represented by the above formula H-1 was 135° C., and the Tg of the compound represented by the above formula IRD1-2 was 306° C.

(4) Subsequently, a compound (a second anthracene-based compound) represented by the above formula ETL2-3 was deposited on the light-emitting layer by a vacuum deposition method, whereby a second electron transport layer having an average thickness of 75 nm was formed.

Incidentally, the Tg of the compound represented by the above formula ETL2-3 was 145° C.

(5) Subsequently, a compound (a first anthracene-based compound: an azaindolizine-based compound) represented by the above formula ETL1-1 was deposited on the second electron transport layer by a vacuum deposition method, whereby a first electron transport layer having an average thickness of 5 nm was formed.

Incidentally, the Tg of the compound represented by the above formula ETL1-1 was 135° C.

(6) Subsequently, a lithium fluoride (LiF) was deposited on the first electron transport layer (electron transport layer) by a vacuum deposition method, whereby an electron injection layer having an average thickness of 1 nm was formed.

(7) Subsequently, Al was deposited on the electron injection layer by a vacuum deposition method, whereby a cathode having an average thickness of 100 nm constituted by Al was formed.

(8) Subsequently, a protective cover (sealing member) made of glass was placed so as to cover the formed respective layers, and fixed and sealed with an epoxy resin.

By the above-mentioned steps, a light-emitting element of Example 1 was produced.

Examples 2 and 3, and Comparative Examples 1 to 7

A light-emitting element was produced in the same manner as in the above Example 1 except that as the types of the hole-injecting material to be used for forming the hole injection layer, the second anthracene-based compound to be used for forming the second electron transport layer, and the first anthracene-based compound to be used for forming the first electron transport layer, those shown in Table 1 were used.

Incidentally, the hole-injecting material (HIL-50), the second anthracene-based compound (ETL2-50), and the first anthracene-based compound (ETL1-50) used in the respective Comparative Examples are compounds having the following formulae, respectively.

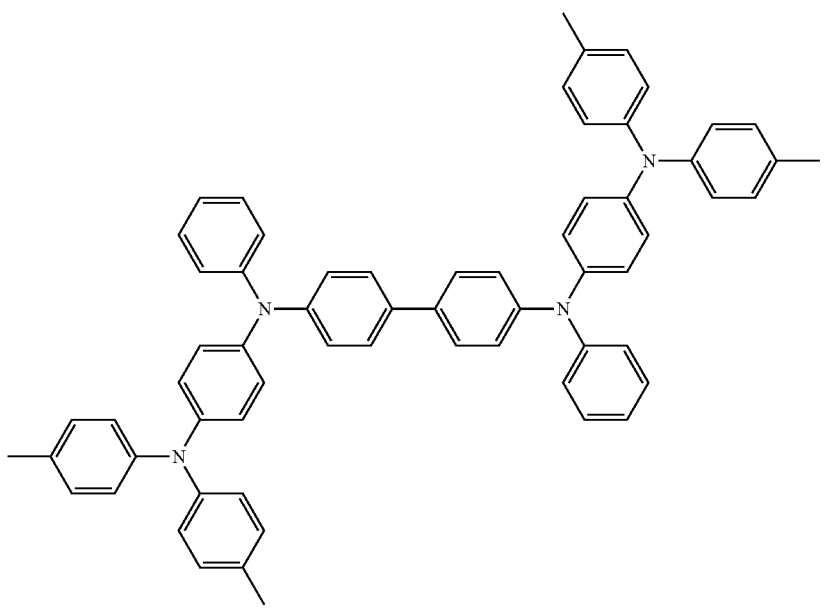

HIL-50

ETL2-50 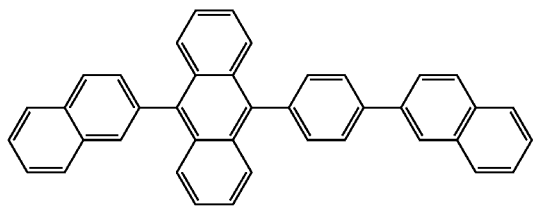

ETL1-50 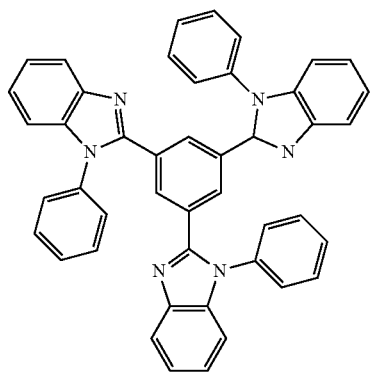

TABLE 1

|  | HIL | | EML*1 | | ETL2 | | ETL1 | |
| --- | --- | --- | --- | --- | --- | --- | --- | --- |
|  | Compound | Tg (° C.) | Compound | Tg (° C.) | Compound | Tg (° C.) | Compound | Tg (° C.) |
| Example 1 | HIL-1 | 137 | H-1 | 135 | ETL2-3 | 145 | ETL1-1 | 135 |
| Example 2 | HIL-21 | 174 | H-1 | 135 | ETL2-3 | 145 | ETL1-1 | 135 |
| Example 3 | HIL-1 | 137 | H-1 | 135 | ETL1-1 | 135 | ETL1-1 | 135 |
| Comparative Example 1 | HIL-50 | 121 | H-1 | 135 | ETL2-50 | 128 | ETL1-50 | 122 |
| Comparative Example 2 | HIL-1 | 137 | H-1 | 135 | ETL2-50 | 128 | ETL1-50 | 122 |
| Comparative Example 3 | HIL-50 | 121 | H-1 | 135 | ETL2-3 | 145 | ETL1-50 | 122 |
| Comparative Example 4 | HIL-50 | 121 | H-1 | 135 | ETL2-50 | 128 | ETL1-1 | 135 |
| Comparative Example 5 | HIL-1 | 137 | H-1 | 135 | ETL2-50 | 128 | ETL1-1 | 135 |
| Comparative Example 6 | HIL-1 | 137 | H-1 | 135 | ETL2-3 | 145 | ETL1-50 | 122 |
| Comparative Example 7 | HIL-50 | 121 | H-1 | 135 | ETL2-3 | 145 | ETL1-1 | 135 |

*1: The light-emitting dopants of EML are all IRD1-2

3. Evaluation 3-1. Basic Characteristics

With respect to each of the light-emitting elements of the respective Examples and Comparative Examples, a constant current of 1.0 A/cm$^2$ was allowed to flow through the light-emitting element using a constant current power supply (KEITHLEY 2400 manufactured by TOYO Corporation), and the emission intensity in a wavelength range of 700 nm to 1000 nm at that time was measured using a compact fiber optical spectrometer (S2000, manufactured by Ocean Optics, Inc.). Based on the measurement results, the emission output (mW/cm$^2$) and the maximum wavelength (nm) in the light-emitting element were determined.

Further, with respect to each of the light-emitting elements of the respective Examples and Comparative Examples, the light-emitting element is allowed to emit light while fixing the initial luminance by allowing a constant current of 1.0 A/cm$^2$ to flow through the light-emitting element, and the luminance was measured using a luminometer. Then, a time until the luminance decreased to 80% of the initial luminance (LT80) was determined.

These measurement results are shown in Table 2.

TABLE 2

|  | Emission PW*2 (mW/cm$^2$) | LT80 (hr) | Maximum wavelength (nm) |
| --- | --- | --- | --- |
| Example 1 | 46.6 | 80 | 770 |
| Example 2 | 46.5 | 140 | 770 |
| Example 3 | 48.5 | 60 | 770 |
| Comparative Example 1 | 43.8 | 20 | 770 |
| Comparative Example 2 | 47.6 | 20 | 770 |
| Comparative Example 3 | 45.3 | 20 | 770 |
| Comparative Example 4 | 46.8 | 20 | 770 |
| Comparative Example 5 | 48.6 | 20 | 770 |
| Comparative Example 6 | 46.8 | 20 | 770 |
| Comparative Example 7 | 48 | 20 | 770 |

*2: 1.0 A/cm$^2$ at the time of driving

As shown in Table 2, since the light-emitting layers have the same configuration in the respective Examples and in the respective Comparative Examples, the emission output and the maximum wavelength are substantially the same levels as expected.

Further, the results showed that from the viewpoint of the constant current life (LT80), by using compounds having a high glass transition temperature Tg (particularly 135° C. or higher) as the organic materials contained in the light-emitting layer, the hole injection layer, the first electron transport layer, and the second electron transport layer, the constant current life is improved.

3-2. Thermal Durability Test

Each of the light-emitting elements of the respective Examples and Comparative Examples was left under the predetermined temperature condition (110° C. to 140° C.) in a thermostat bath for 2 hours. Thereafter, the emission intensity in a wavelength range of 700 nm to 1000 nm was measured using the same method as described in the above 3-1.

Then, the emission intensity measured in the above 3-1 and the emission intensity after the light-emitting element was left under the predetermined temperature condition were compared, and evaluation was performed according to the following evaluation criteria.

Evaluation Criteria for Thermal Durability Test

A: No change in spectral shape is observed, and the emission after heating is normal.

B: A change or shift in spectral shape is observed, and abnormality is observed in the emission after heating.

The evaluation results are shown in Table 3.

TABLE 3

| | Heating temperature | | | |
|---|---|---|---|---|
| | 110° C. | 130° C. | 130° C. | 140° C. |
| Example 1 | A | A | A | A |
| Example 2 | A | A | A | A |
| Example 3 | A | A | A | A |
| Comparative Example 1 | A | A | B | B |
| Comparative Example 2 | A | A | B | B |
| Comparative Example 3 | A | A | B | B |
| Comparative Example 4 | A | A | B | B |
| Comparative Example 5 | A | A | B | B |
| Comparative Example 6 | A | A | B | B |
| Comparative Example 7 | A | A | B | B |

As shown in Table 3, in the respective Examples, compounds having a glass transition temperature Tg of 135° C. or higher were used as the organic materials contained in the light-emitting layer, the hole injection layer, the first electron transport layer, and the second electron transport layer, respectively, and therefore, even when the light-emitting element was heated under the condition of 140° C., no change in spectral shape was observed, and the emission after heating was normal.

On the other hand, in the respective Comparative Examples, a compound having a glass transition temperature Tg of lower than 135° C. was used as at least one of the organic materials contained in the light-emitting layer, the hole injection layer, the first electron transport layer, and the second electron transport layer, and due to this, when the light-emitting element was heated under the condition of 130° C. or higher, a change in spectral shape was observed, and abnormality occurred in the emission after heating.

3-3. High Current Durability Test

Each of the light-emitting elements of the respective Examples and Comparative Example 1 was driven for 10 minutes by conducting electricity at a current density of 1.0 A/cm² or more as shown in Table 4. Thereafter, the emission intensity in a wavelength range of 700 nm to 1000 nm was measured using the same method as described in the above 3-1.

Then, the emission intensity measured in the above 3-1 and the emission intensity after the light-emitting element was driven at a current density of 1.0 A/cm² or more were compared, and evaluation was performed according to the following evaluation criteria.

Evaluation Criteria for High Current Durability Test

A: No change in spectral shape is observed, and the emission after the light-emitting element is driven for 10 minutes is normal.

B: A change or shift in spectral shape is observed, and abnormality is observed in the emission after the light-emitting element is driven for 10 minutes.

The evaluation results are shown in Table 4.

TABLE 4

| | Applied current density | | | | | |
|---|---|---|---|---|---|---|
| | 1.5 A/cm² | 1.6 A/cm² | 1.7 A/cm² | 1.8 A/cm² | 1.9 A/cm² | 2.0 A/cm² |
| Example 1 | A | A | A | A | A | A |
| Example 2 | A | A | A | A | A | A |
| Example 3 | A | A | A | A | A | A |
| Comparative Example 1 | A | A | A | B | B | B |

As shown in Table 4, in the respective Examples, compounds having a glass transition temperature Tg of 135° C. or higher were used as the organic materials contained in the light-emitting layer, the hole injection layer, the first electron transport layer, and the second electron transport layer, respectively, and therefore, even when the light-emitting element was driven at a current density of 2.0 A/cm², no change in spectral shape was observed, and the emission after the light-emitting element was driven for 10 minutes was normal.

On the other hand, in Comparative Example 1, a compound having a glass transition temperature Tg of lower than 135° C. was used as at least one of the organic materials contained in the light-emitting layer, the hole injection layer, the first electron transport layer, and the second electron transport layer, and due to this, when the light-emitting element was driven at a current density of 1.8 A/cm² or more, a change in spectral shape was observed, and abnormality occurred in the emission after the light-emitting element was driven for 10 minutes.

The entire disclosure of Japanese Patent Application No. 2015-113354 filed Jun. 3, 2015 is hereby incorporated herein by reference.

What is claimed is:

1. A light-emitting element, comprising:
   an anode;
   a cathode;
   a light-emitting layer which is provided between the anode and the cathode and emits light in a wavelength range of 700 nm or more by conducting electricity between the anode and the cathode;

a hole injection layer which is provided between the light-emitting layer and the anode; and an electron transport layer which is provided between the light-emitting layer and the cathode, and includes a first electron transport layer located on the cathode side and a second electron transport layer located on the light-emitting layer side, wherein organic materials contained in the light-emitting layer, the hole injection layer, the first electron transport layer, and the second electron transport layer have a glass transition temperature Tg of 135° C. or higher or do not have a glass transition temperature, wherein the hole injection layer comprises a HIL-B compound or a HIL-C compound, the HIL-B compound having the following general formula:

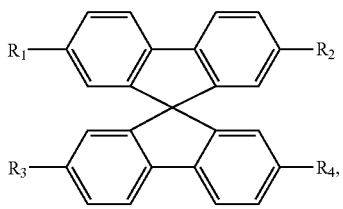

HIL-B where $R_1$-$R_4$ are selected from a hydrogen atom, an arylamino group, a carbazolyl group, and combinations thereof; and the HIL-C compound having the following general formula:

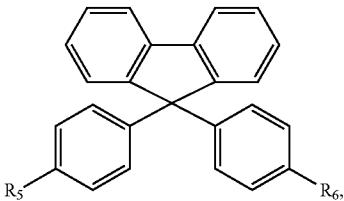

HIL-C where $R_5$-$R_6$ are selected from an arylamino group, a carbazolyl group, and combinations thereof;

wherein the light emitting layer comprises a thiadiazole-based compound (IRD1) having the following general formula:

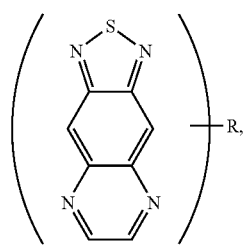

(IRD1)

where R is selected from an aryl group, an arylamino group, a triarylamino group, and derivatives thereof;

wherein the first electron transport layer comprises a first anthracene-based compound having an anthracene skeleton and a nitrogen-containing heterocyclic skeleton, the anthracene skeleton having the following general formula:

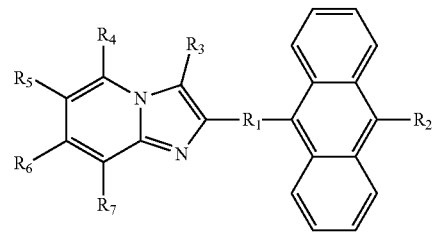

(ETL1)

where $R_1$-$R_7$ are selected from a hydrogen atom, an alkyl group, an aryl group, an aryl group with substituent, an arylamino group, and combinations thereof; and wherein the second electron transport layer comprises a second anthracene-based compound lacking a heterocyclic skeleton and having the general formula:

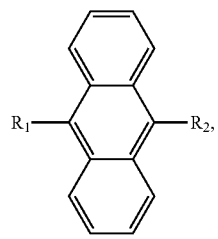

ETL2-A where $R_1$ and $R_2$ are selected from a hydrogen atom, an alkyl group, an aryl group, an aryl group with substituent, an arylamino group, an arylamino group with substituent, and combinations thereof.

2. The light-emitting element according to claim 1, wherein the second anthracene-based compound has a glass transition temperature Tg of 145° C. or higher or does not have a glass transition temperature.

3. A light-emitting device, comprising the light-emitting element according to claim 2.

4. An authentication device, comprising the light-emitting element according to claim 2.

5. An electronic apparatus, comprising the light-emitting element according to claim 2.

6. The light-emitting element according to claim 1, wherein the glass transition temperature ($T_g$) of the light-emitting layer is represented by Tg(Host), the glass transition temperature ($T_g$) of the hole injection layer is represented by Tg(HIL), and the glass transition temperature ($T_g$) of the second electron transport layer is represented by Tg(ETL2), and wherein the glass transition temperature (Tg) of the light-emitting layer Tg(Host), the glass transition temperature (Tg) of the hole injection layer Tg(HIL), and the glass transition temperature (Tg) of the second anthracene-based compound Tg(ETL2) satisfy the following relational formula (I):

$$Tg(HIL) > Tg(Host) \text{ and } Tg(ETL2) > Tg(Host) \quad \text{(I)}.$$

7. The light-emitting element according to claim 6, wherein further Tg(HIL) and Tg(ETL2) satisfy the following relational formula (II):

$$Tg(HIL) > Tg(ETL2) \tag{II}$$

8. A light-emitting device, comprising the light-emitting element according to claim 6.

9. The light-emitting element according to claim 1, wherein the light-emitting element is configured to conduct electricity between the anode and the cathode at a current density of 0.5 A/cm$^2$ or more and 2.0 A/cm$^2$ or less.

10. A light-emitting device, comprising the light-emitting element according to claim 1.

11. An authentication device, comprising the light-emitting element according to claim 1.

12. An electronic apparatus, comprising the light-emitting element according to claim 1.

* * * * *